(12) United States Patent
Willer et al.

(10) Patent No.: US 7,790,516 B2
(45) Date of Patent: Sep. 7, 2010

(54) METHOD OF MANUFACTURING AT LEAST ONE SEMICONDUCTOR COMPONENT AND MEMORY CELLS

(75) Inventors: Josef Willer, Riemerling (DE); Nicolas Nagel, Dresden (DE)

(73) Assignee: Qimonda AG, Munich (DE)

( * ) Notice: Subject to any disclaimer, the term of this patent is extended or adjusted under 35 U.S.C. 154(b) by 587 days.

(21) Appl. No.: 11/483,968

(22) Filed: Jul. 10, 2006

(65) Prior Publication Data
US 2008/0009115 A1 Jan. 10, 2008

(51) Int. Cl.
*H01L 21/82* (2006.01)

(52) U.S. Cl. .................. 438/129; 438/128; 257/314; 257/315

(58) Field of Classification Search .......... 257/202, 257/315, 402; 438/129, 424, 524, 597, 778, 438/791
See application file for complete search history.

(56) References Cited

U.S. PATENT DOCUMENTS

| | | | |
|---|---|---|---|
| 6,137,718 A | 10/2000 | Reisinger | |
| 6,461,905 B1 * | 10/2002 | Wang et al. | 438/183 |
| 6,686,242 B2 | 2/2004 | Willer et al. | |
| 6,756,631 B2 * | 6/2004 | Wu | 257/316 |
| 6,867,453 B2 | 3/2005 | Shin et al. | |
| 7,005,355 B2 | 2/2006 | Kleint et al. | |
| 7,271,083 B2 * | 9/2007 | Tu et al. | 438/597 |
| 7,364,951 B2 * | 4/2008 | Goda et al. | 438/128 |
| 7,436,017 B2 * | 10/2008 | Lee et al. | 257/314 |
| 2002/0020890 A1 | 2/2002 | Willer | |
| 2003/0075756 A1 * | 4/2003 | Suzuki | 257/315 |
| 2004/0119106 A1 * | 6/2004 | Hsieh | 257/314 |
| 2004/0259386 A1 * | 12/2004 | Tanaka et al. | 438/791 |
| 2005/0067633 A1 * | 3/2005 | Mushika | 257/202 |
| 2005/0236660 A1 * | 10/2005 | Watanobe et al. | 257/315 |
| 2006/0081906 A1 * | 4/2006 | Jeong | 257/314 |
| 2006/0124991 A1 | 6/2006 | Ohba | |
| 2007/0001212 A1 * | 1/2007 | Lee et al. | 257/315 |
| 2007/0059945 A1 * | 3/2007 | Mohklesi | 438/778 |

FOREIGN PATENT DOCUMENTS

| | | |
|---|---|---|
| DE | 196 31 146 A1 | 2/1998 |
| DE | 196 31 147 A1 | 2/1998 |
| DE | 199 55 602 A1 | 5/2001 |
| WO | WO 98/06101 A1 | 2/1998 |
| WO | WO 98/59375 A1 | 12/1998 |
| WO | WO 00/45441 A2 | 8/2000 |
| WO | WO 00/45441 A3 | 8/2000 |

\* cited by examiner

*Primary Examiner*—Thanh V Pham
*Assistant Examiner*—Errol Fernandes

(57) ABSTRACT

A method of manufacturing at least one NAND-coupled semiconductor component is disclosed. A layer structure is formed on or above a semiconductor substrate. The layer structure is patterned to expose at least one region to be doped. The exposed region is doped and annealed. The patterned layer structure is at least partially removed. Replacing material is formed in the region in which the patterned layer structure has been removed, thereby forming the at least one NAND-coupled semiconductor component.

39 Claims, 27 Drawing Sheets

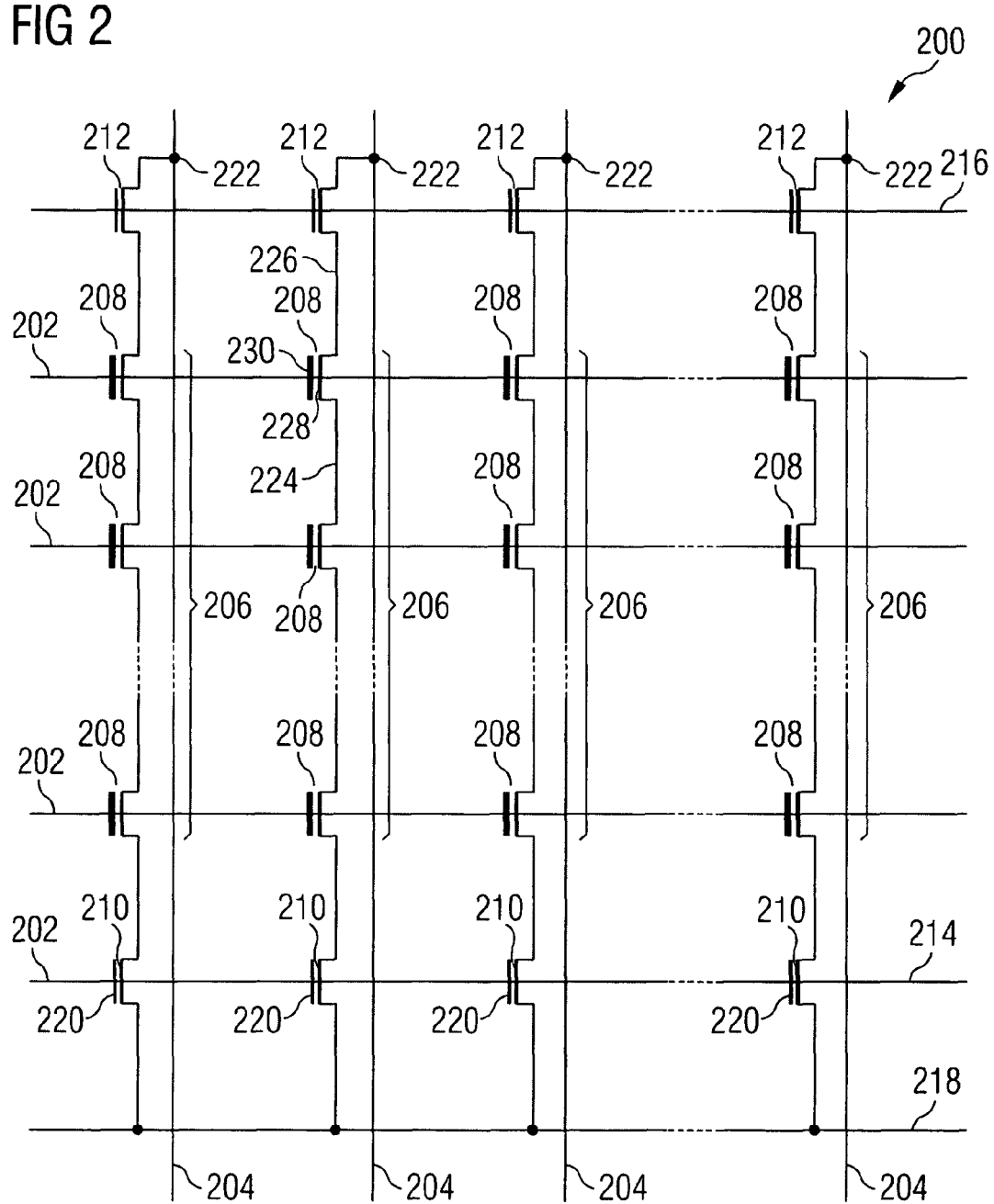

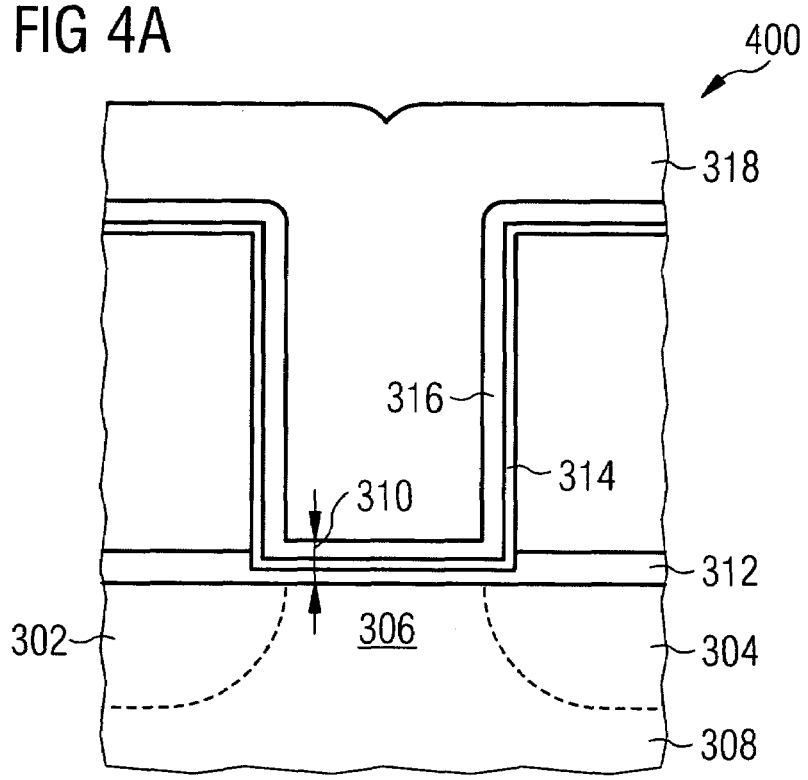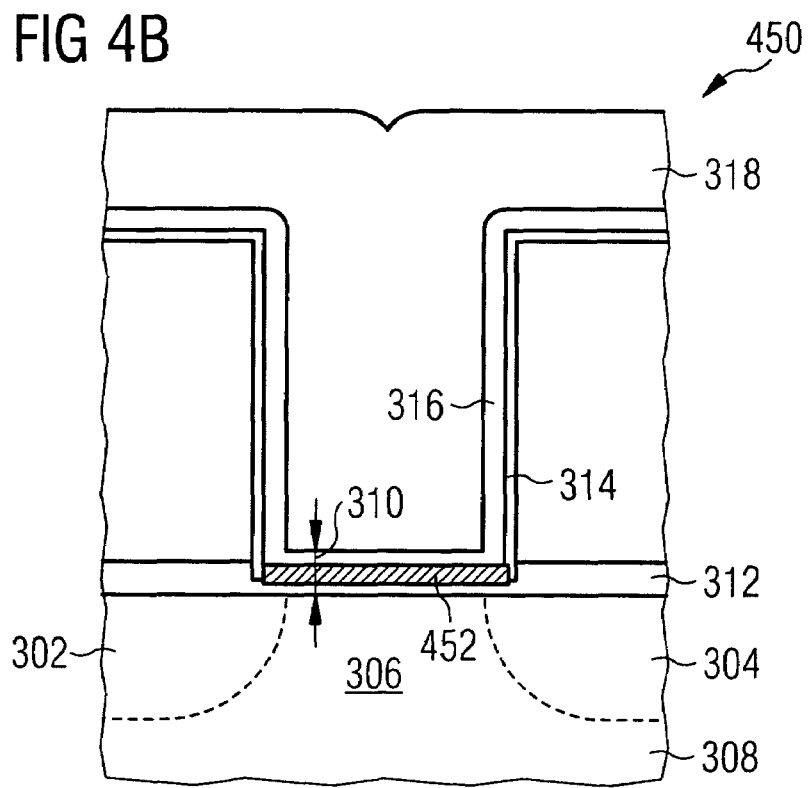

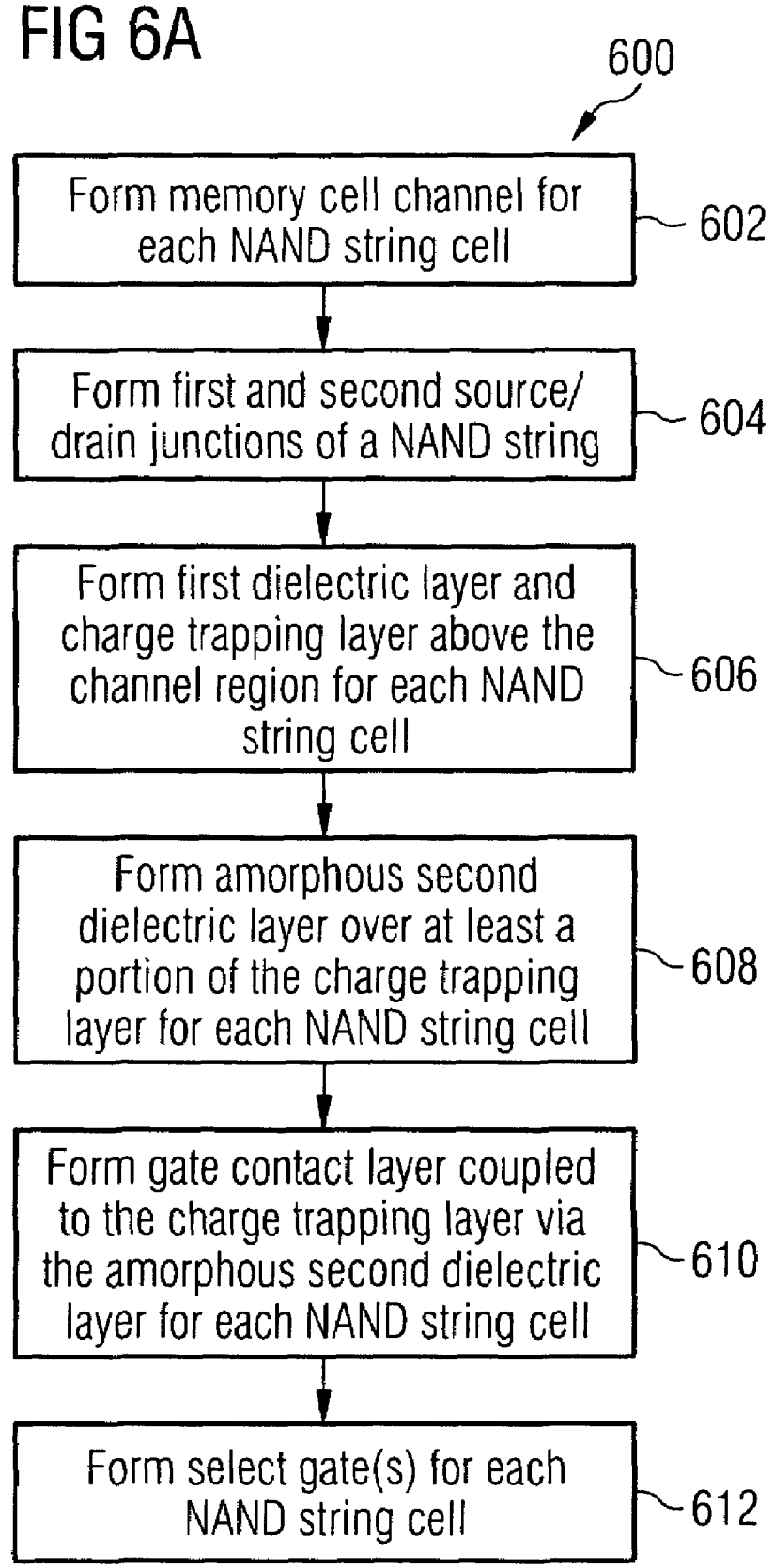

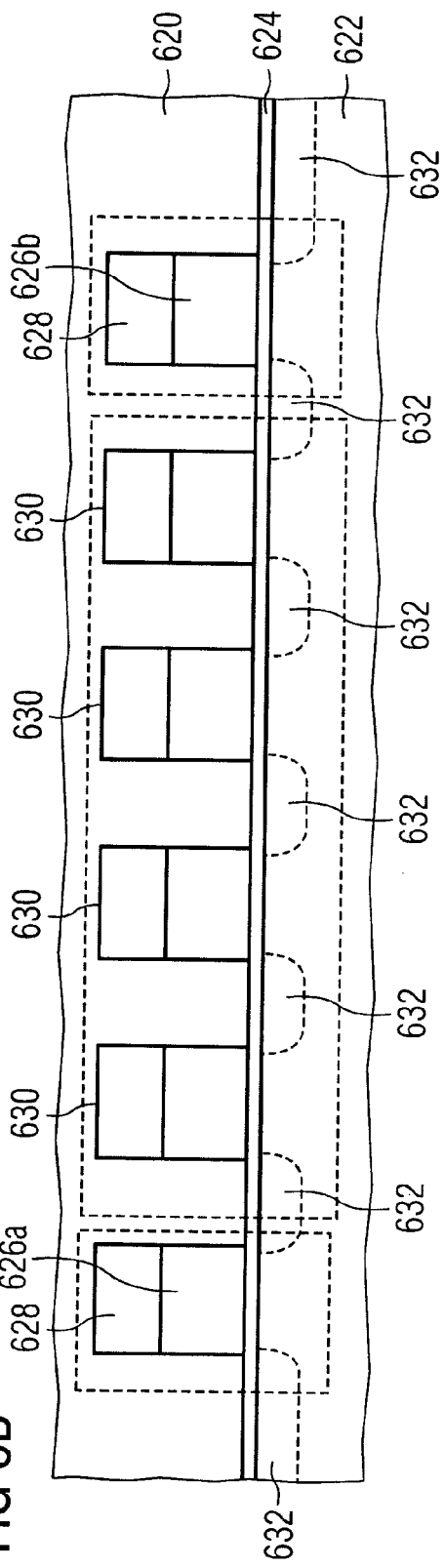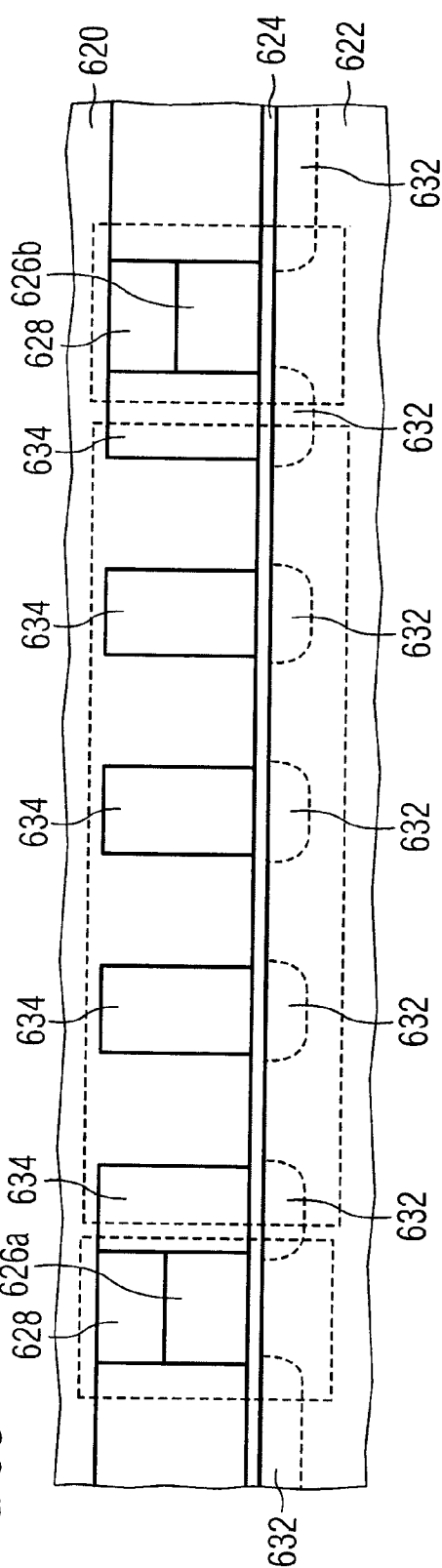

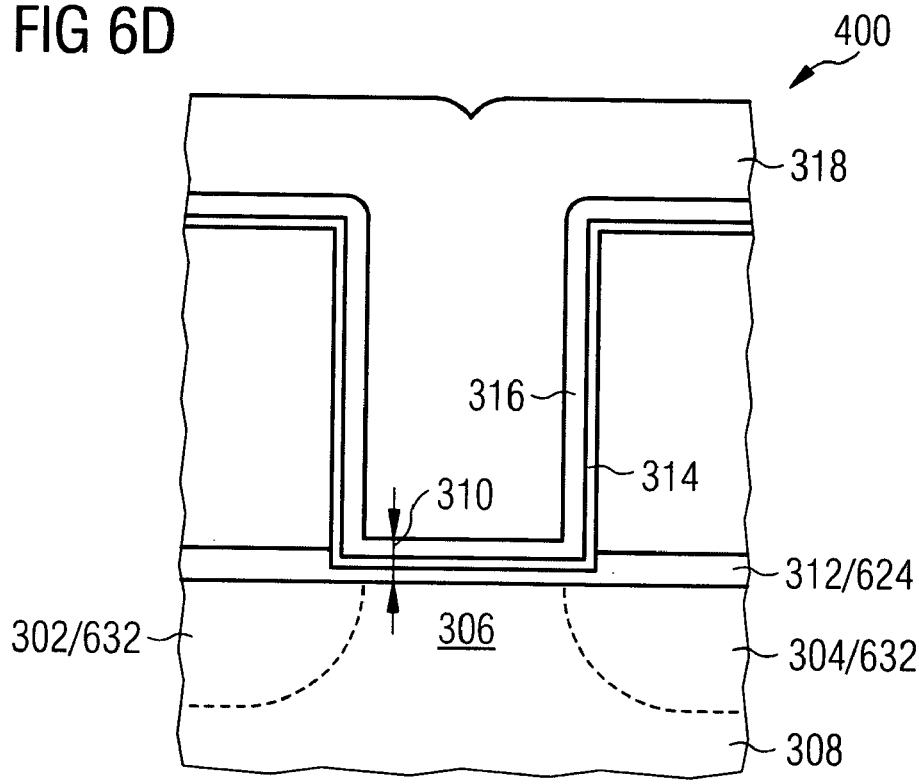
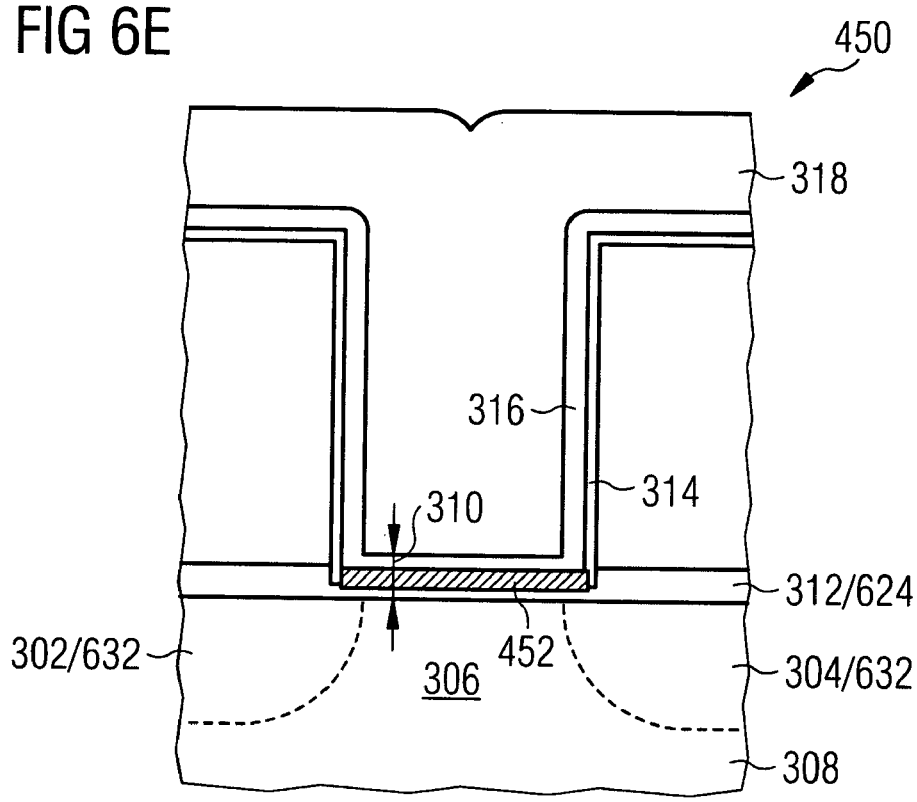

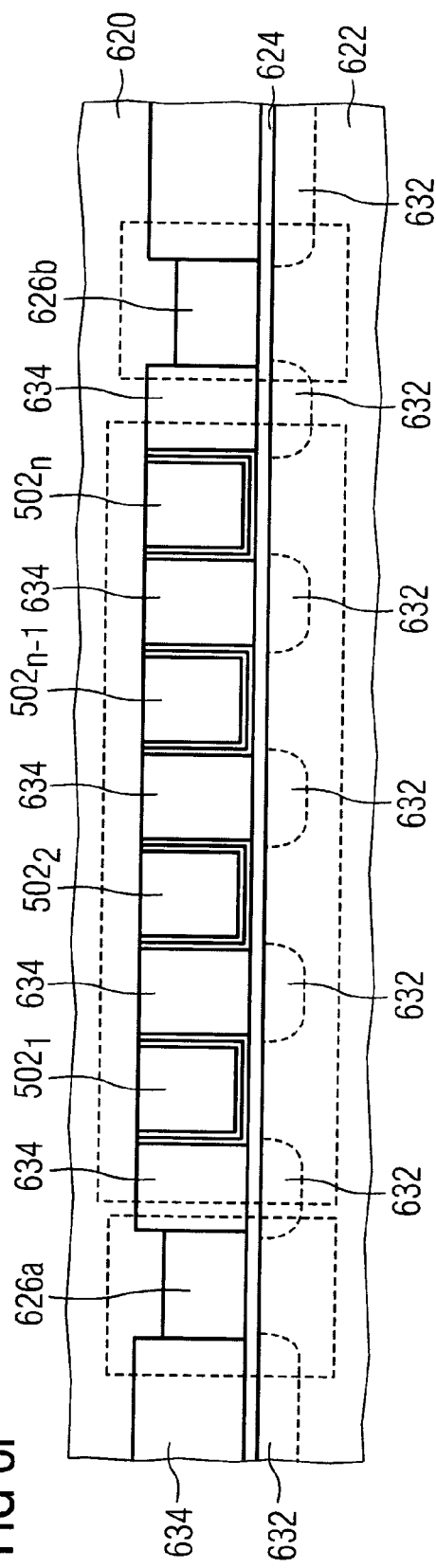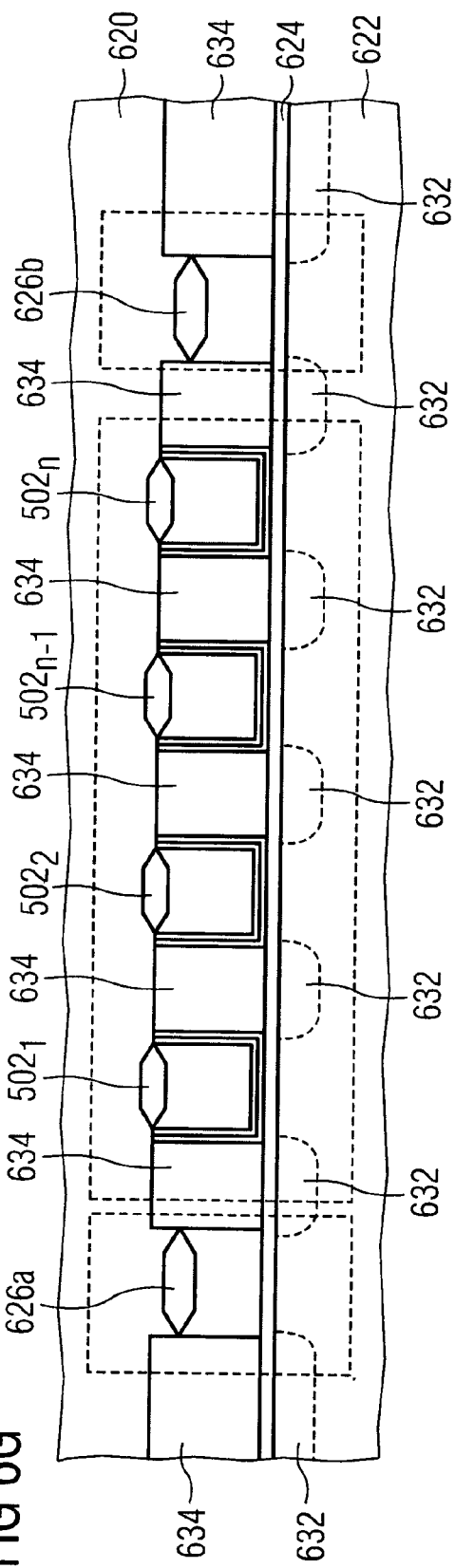

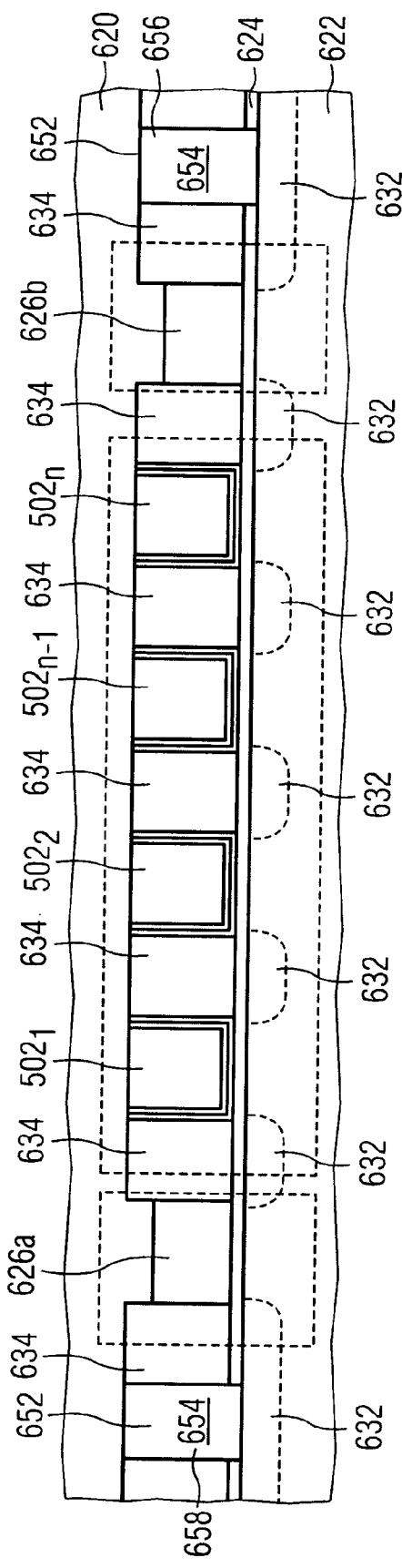

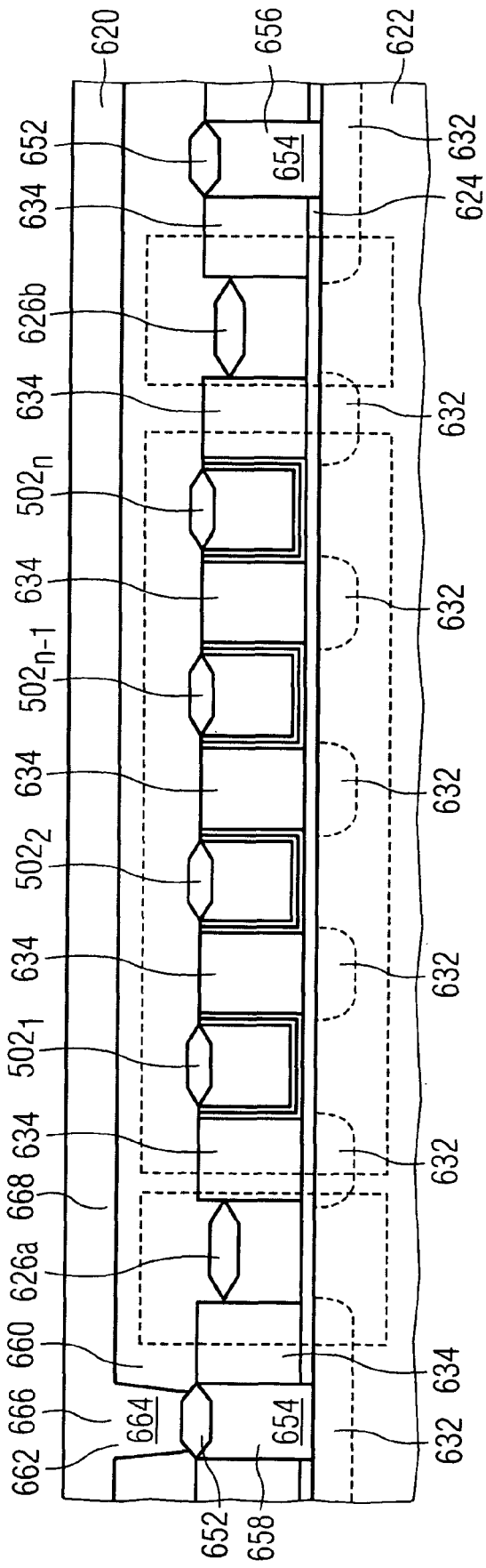

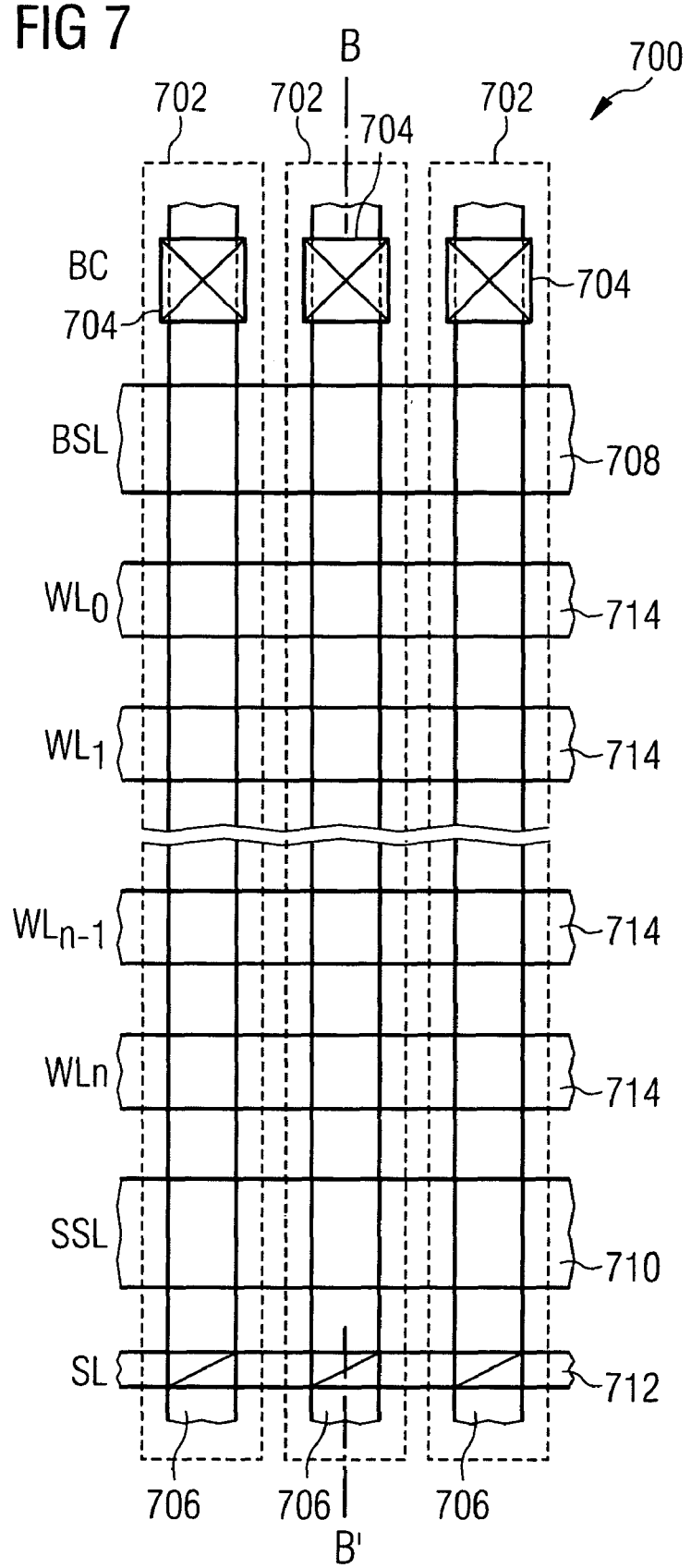

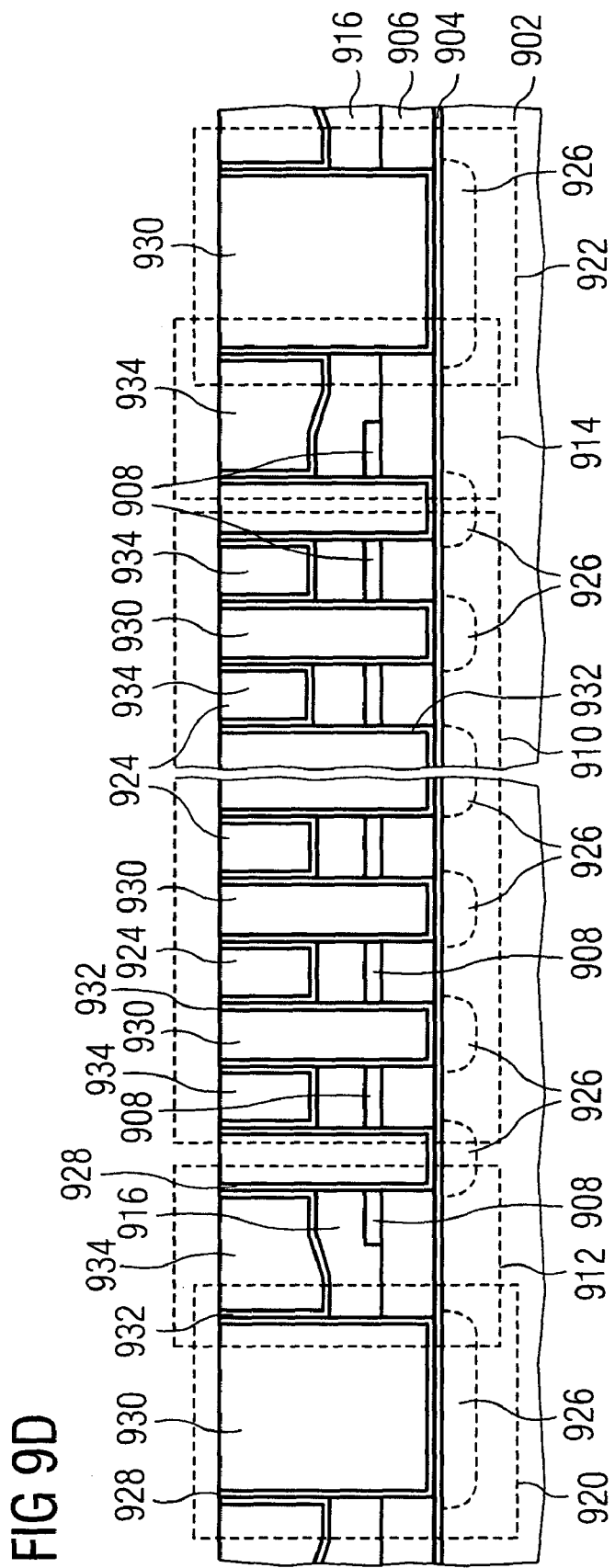

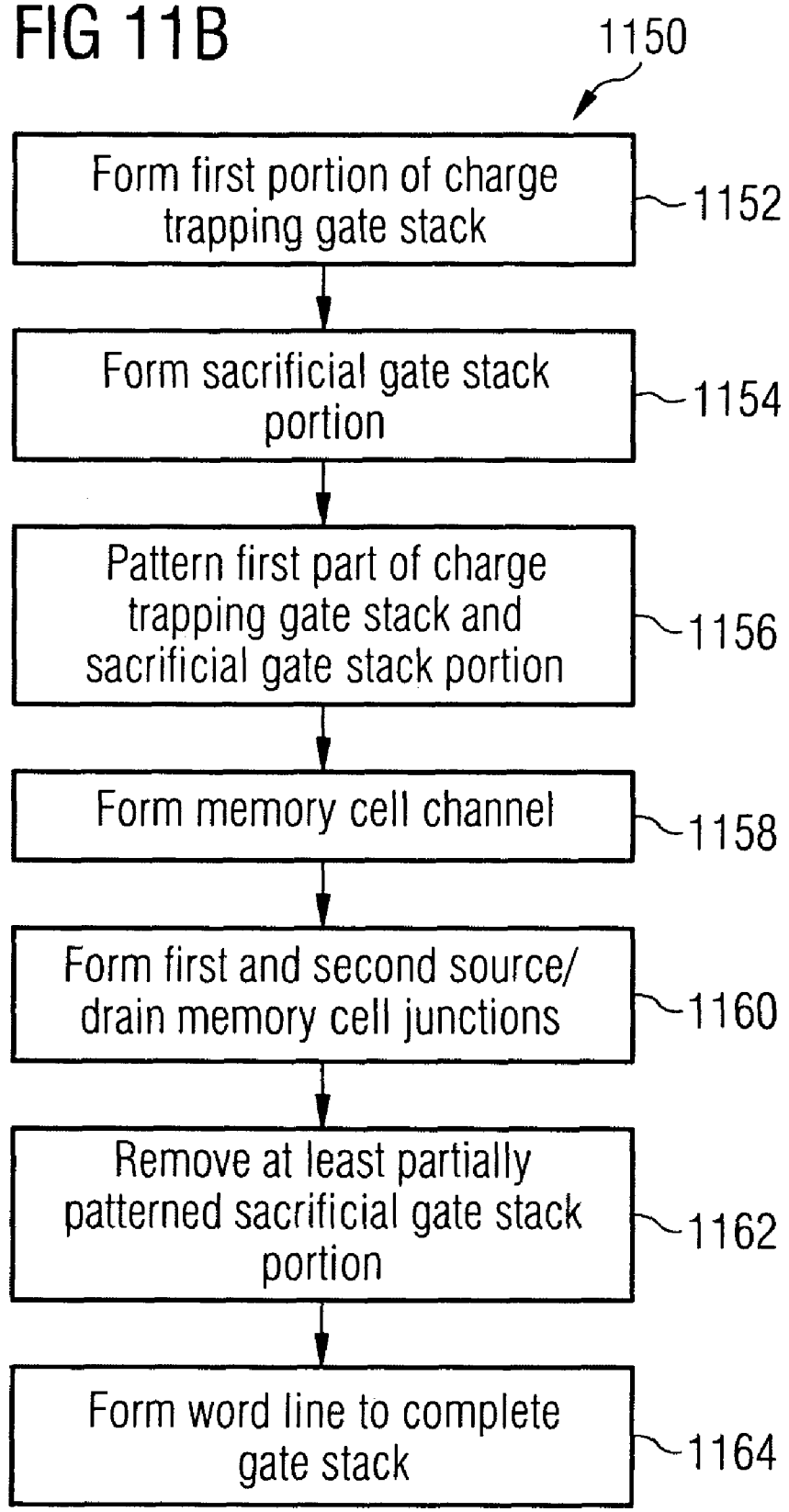

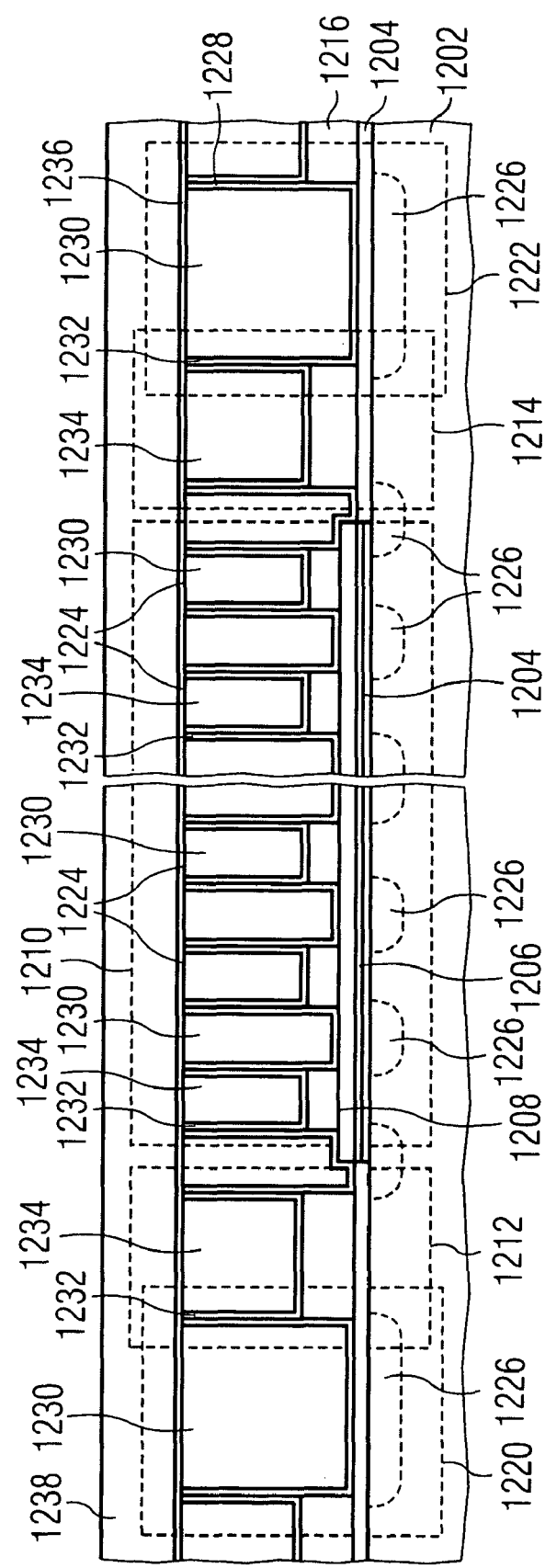

METHOD OF MANUFACTURING AT LEAST ONE SEMICONDUCTOR COMPONENT AND MEMORY CELLS

TECHNICAL FIELD

The invention relates to a method of manufacturing at least one semiconductor component and to memory cells.

BACKGROUND

In a conventional method of manufacturing of a NAND non-volatile memory cell arrangement, a gate stack is formed on or above a substrate. The gate stack usually includes an oxide layer, a charge storage region, e.g., a floating gate layer or a charge-trapping layer structure, on or above the oxide layer and a gate region on or above the charge storage region.

In case of a floating gate memory cell arrangement, usually a dielectric layer structure is provided on or above the floating gate layer (usually made of polysilicon), the dielectric layer structure serving as a gate coupling dielectric. The gate region (in case of a floating gate memory cell arrangement a so-called control gate region) usually includes one or more polysilicon layers being connected to a word line.

In case of a charge-trapping memory cell arrangement, usually an oxide-nitride-oxide layer structure is provided on or above the substrate, the oxide-nitride-oxide layer structure being used for trapping electrical charge carriers. A gate region having one or more polysilicon layers is usually provided on or above the oxide-nitride-oxide layer structure. The gate region is usually connected to a word line as well.

In both cases, the material used for the word line is usually a refractory metal such as tungsten (W) or tungsten silicide (WSi).

In common methods of manufacturing the cells, the gate stack is structured and then, a self-aligned implantation of doping atoms into the substrate is carried out using the patterned gate stack as a mask. Subsequently, the implanted doping atoms are activated, thereby forming the source/drain regions. The activation is carried out using a high-temperature anneal at a temperature of about 1050° C. for about 10 seconds.

SUMMARY OF THE INVENTION

In one embodiment of the invention, a method of manufacturing at least one semiconductor component includes forming a layer structure on or above a semiconductor substrate and patterning the layer structure, thereby exposing at least one region to be doped. The exposed at least one region is doped and annealing and the patterned layer structure is at least partially removed. Replacing material is formed in the region in which the patterned layer structure has been removed, thereby forming the at least one NAND-coupled semiconductor component.

These and other features of the invention will be better understood when taken in view of the following drawings and a detailed description.

BRIEF DESCRIPTION OF THE DRAWINGS

For a more complete understanding of the present invention, and the advantages thereof, reference is now made to the following descriptions taken in conjunction with the accompanying drawing, in which:

FIG. 2 illustrates a circuit diagram of a NAND memory array in accordance with one embodiment of the present invention;

FIG. 4A illustrates a first specific embodiment of a charge-trapping memory cell in accordance with one embodiment of the present invention;

FIG. 4B illustrates a second specific embodiment of a charge-trapping memory cell in accordance with one embodiment of the present invention;

FIG. 6A illustrates an exemplary method of manufacturing a NAND array of charge-trapping memory cells in accordance with one embodiment of the present invention;

FIGS. 6B to 6K illustrate a cross-sectional view of the NAND array portion in various states of manufacture in accordance with one embodiment of the present invention;

FIG. 7 illustrates a layout of a NAND memory array in accordance with one embodiment of the present invention;

FIGS. 9A to 9E illustrate a cross-sectional view through cross section B-B' of the NAND memory array shown in FIG. 7 in various states of manufacture in accordance with one embodiment of the present invention;

FIG. 11B illustrates an exemplary method for manufacturing a charge-trapping memory cell in accordance with the present invention;

FIGS. 12A to 12E illustrate a cross-sectional view through cross section B-B' of the NAND memory array shown in FIG. 7 in various states of manufacture in accordance with another embodiment of the present invention.

Figure 1:
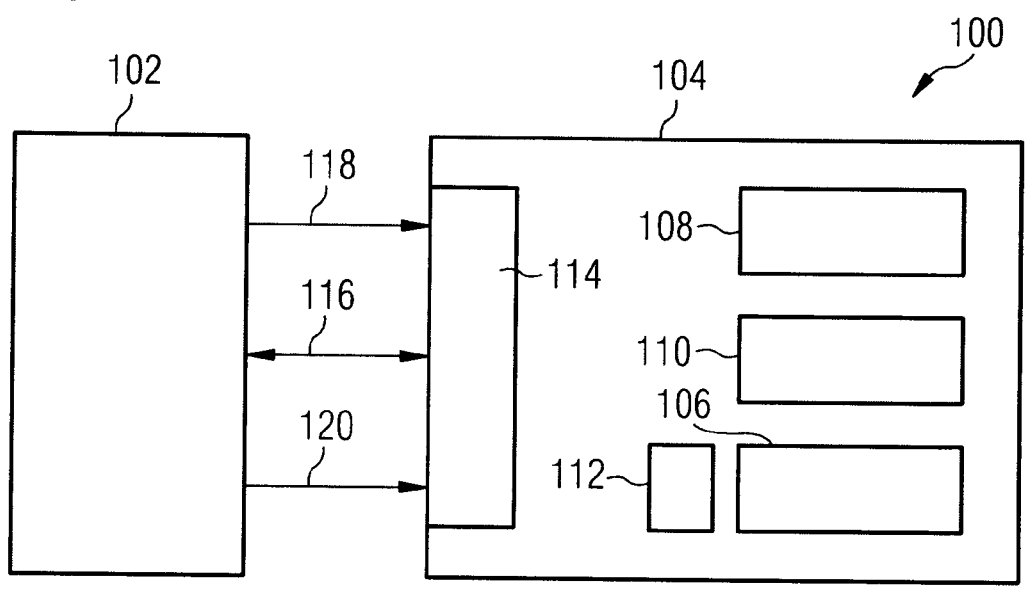
FIG. 1 illustrates a simplified memory system in accordance with an embodiment of the present invention.

For clarity, previously described features retain their reference numerals in subsequent drawings.

DETAILED DESCRIPTION OF ILLUSTRATIVE EMBODIMENTS

In one embodiment of the invention, a method of manufacturing at least one semiconductor component includes forming a layer structure on or above a semiconductor substrate and patterning the layer structure, thereby exposing at least one region to be doped. The exposed at least one region is doped and annealing and the patterned layer structure is at least partially removed. Replacing material is formed in the region in which the patterned layer structure has been removed, thereby forming the at least one NAND-coupled semiconductor component.

In one embodiment of the invention, forming the layer structure on or above the semiconductor substrate includes forming a gate isolation layer on or above the substrate. In other words, in this embodiment, a gate isolation layer, e.g., made of oxide, e.g., made of silicon oxide, is deposited on or above the main processing surface of the substrate.

In one embodiment of the invention, forming the layer structure on or above a semiconductor substrate includes forming a gate layer on or above the gate isolation layer.

In another embodiment of the invention, forming the layer structure on or above the semiconductor substrate includes forming an auxiliary mask layer on or above the gate layer. The auxiliary mask layer may be made of a material being selected from a group of materials consisting of silicon oxide, silicon nitride and carbon. However, any other material suitable for the auxiliary mask, e.g., a so-called hardmask, may be used in an alternative embodiment of the invention.

In one embodiment of the invention, a further mask layer may be formed on or above the auxiliary mask layer. The further mask layer may be a photoresist layer. Positive photoresist material (the portions of the photoresist material that, are exposed to light will be removed by means of a developer and the unexposed portions of the photoresist material will remain on or above the auxiliary mask layer) can be used as well as negative photoresist material (the portions of the photoresist material that are exposed to light will remain on or above the auxiliary mask layer and the unexposed portions of the photoresist material will be removed by means of a developer).

In one embodiment of the invention, patterning the layer structure includes exposing at least two regions to be doped.

When doping the exposed at least two regions to be doped, a first source/drain region and a second source drain region may be formed. The first and second source/drain regions may be part of a respective field effect transistor (FET), which should be formed, the FET possibly being configured as a non-volatile memory cell FET.

The annealing of the doped region may include an activation of the doped region. The annealing process may be carried out at a temperature of at least 800° C., e.g., at a temperature of at least 900° C., e.g., at a temperature of at least 1000° C.

In one exemplary embodiment of the invention, a plurality of semiconductor components are manufactured, e.g., thousands or millions of semiconductor components or even more.

In another embodiment of the invention, trenches in the patterned layer structure above the at least two doped regions are at least partially filled with a filling material. Furthermore, the patterned layer structure is at least partially removed using the filling material as a mask. This enables a self-aligned removal, e.g., etch, of the patterned layer structure, wherein the patterned layer structure can be removed completely or partially, as it is desired according to the required process scheme. An oxide may be used as filling material.

Furthermore, at least partially removing the patterned layer structure may include removing the auxiliary mask layer. In other words, the auxiliary mask layer is removed, so that in this case, the underlying patterned gate layer is exposed.

In another embodiment of the invention, at least partially removing the patterned layer structure includes removing the gate layer. In other words, according to this embodiment of the invention, also the patterned gate layer is partially or completely removed.

In accordance with one embodiment of the invention, the substrate includes a first substrate region and a second substrate region. The first substrate region is provided for manufacturing select semiconductor components and the second substrate region is provided for manufacturing memory semiconductor components.

In this embodiment, at least partially removing the patterned layer structure may be carried out only in the second substrate region. This means that the removal of the patterned auxiliary mask layer and optionally also of the patterned gate layer is performed only in the second substrate region, e.g., only the regions in which the memory cells of a NAND string are provided.

Furthermore, forming replacing material in the region in which the patterned layer structure has been removed may include forming a charge storage layer structure on or above the gate isolation layer in the region in which the patterned layer structure has been removed. The charge storage layer structure may be a floating gate layer. In an alternative embodiment of the invention, the charge storage layer structure is a charge-trapping layer structure. The charge-trapping layer structure may include a dielectric layer made of a material selected from the group consisting of silicon nitride ($Si_3N_4$), aluminum oxide ($Al_2O_3$), hafnium oxide ($HfO_2$), zirconium oxide ($ZrO_2$), yttrium oxide ($Y_2O_3$), lanthanum oxide ($LaO_2$), amorphous silicon, tantalum oxide ($Ta_2O_5$), titanium oxide ($TiO_2$), and an aluminate. An example for an aluminate is an alloy of the components aluminum, zirconium and oxygen (AlZrO).

Furthermore, in an alternative embodiment of the invention, the charge-trapping layer structure includes a nitride-oxide layer structure, thereby forming an ONO structure together with the gate isolation layer, which may be made of an oxide.

In another embodiment of the invention, forming a layer structure on or above the substrate includes forming a gate layer structure on or above the gate isolation layer. The formation of the gate layer structure may include forming a floating gate layer on or above the gate isolation layer, forming a dielectric layer on or above the floating gate layer, and forming a control gate layer on or above the dielectric layer. In this way, a floating gate memory cell is manufactured.

In one embodiment of the invention, forming the layer structure on or above the substrate may include forming an auxiliary mask layer on or above the gate layer structure.

In an alternative embodiment of the invention, forming the layer structure on or above the substrate includes forming a charge-trapping layer structure on or above the gate isolation layer. The charge-trapping layer structure may include a dielectric layer made of a material selected from the group consisting of silicon nitride ($Si_3N_4$), aluminum oxide ($Al_2O_3$), hafnium oxide ($HfO_2$), zirconium oxide ($ZrO_2$), yttrium oxide ($Y_2O_3$), lanthanum oxide ($LaO_2$), amorphous silicon, tantalum oxide ($Ta_2O_5$), titanium oxide ($TiO_2$), and an aluminate. An example for an aluminate is an alloy of the components aluminum, zirconium and oxygen (AlZrO).

In an alternative embodiment of the invention, the charge-trapping layer structure includes one, two, three, four or even more dielectric layers being formed above one another.

Furthermore, in an alternative embodiment of the invention, the charge-trapping layer structure includes a nitride-oxide layer structure, thereby forming an ONO structure together with the gate isolation layer, which may be made of an oxide.

Forming the layer structure on or above the substrate may include forming a control gate layer on or above the charge-trapping layer structure.

Furthermore, forming the layer structure on or above the substrate may include forming an auxiliary mask layer on or above the charge-trapping layer structure.

In another embodiment of the invention, the method further includes forming a diffusion barrier layer in the trenches in the patterned layer structure above the at least two doped regions, and at least partially filling the trenches with a filling material on or above the diffusion barrier layer. The diffusion barrier layer may include silicon nitride or silicon oxynitride.

At least partially removing the patterned layer structure may include removing the auxiliary mask layer.

Moreover, forming conductive material may include forming a conductive diffusion barrier layer.

In one embodiment of the invention, forming conductive material includes forming word line conductor material, e.g., word line metal. The word line metal may be selected from the group consisting of copper (Cu), aluminum (Al), silver (Ag). In this embodiment of the invention, the conductive material may have a resistivity of less than or equal to 5 µohmcm. In one embodiment of the invention, the conductive material may have a resistivity of less than 10 µohmcm, e.g., a resistivity of less than 6 µohmcm. It should be noted that the conventional word line materials such as tungsten or tungsten silicide have a resistivity of more than 10 µohmcm. Thus, in this embodiment of the invention, a substantial reduction of the resistivity of the word line material and therewith of the word line is achieved. This has, in accordance with one embodiment of the invention, been achieved using a process scheme in which the high temperature process of the activation of the source/drain doping atoms is carried out before the deposition of the word line material. Thus, it became possible to use a word line material that has a melting temperature below the temperature used for the activation of the doping atoms in the source/drain regions.

In accordance with another embodiment of the invention, a method of manufacturing a memory arrangement is provided, including forming a layer structure on or above a substrate, the substrate having a first substrate region and a second substrate region, the first substrate region being provided for manufacturing select semiconductor components, the second substrate region being provided for manufacturing memory semiconductor components, patterning the layer structure, thereby exposing a plurality of regions to be doped, doping the exposed regions to be doped, annealing the doped regions, at least partially removing the patterned layer structure only in the second substrate region, forming a charge storage layer structure on or above the gate isolation layer in the region in which the patterned layer structure has been removed, and forming conductive material on or above the charge storage layer structure.

The memory arrangement may be a NAND memory arrangement.

Further, the memory arrangement may be a charge-trapping memory arrangement.

In accordance with another embodiment of the invention, a method of manufacturing a memory arrangement is provided, including forming a gate isolation layer on or above the substrate, forming a gate layer structure on or above the gate isolation layer, forming an auxiliary mask layer on or above the gate layer structure, patterning the auxiliary mask layer and the gate layer structure, doping the exposed regions to be doped, annealing the doped regions, removing the patterned auxiliary mask layer, forming word line conductor material in the regions in which the patterned auxiliary mask layer has been removed.

The memory arrangement may be a NAND memory arrangement.

The memory arrangement may be a charge-trapping memory arrangement.

In accordance with another embodiment of the invention, a method of manufacturing a charge-trapping memory cell is provided, including forming first and second source/drain junctions, each of the first and second source/drain junctions having an implanted dopant profile characterized by a diffusion temperature above which the implanted dopant profile begins to diffuse, and forming a gate junction coupled between the first and second source/drain junctions, the forming of the gate junction including forming a gate region coupled between the first and second source/drain junctions, forming a charge-trapping layer coupled to the gate region via a first dielectric layer, forming a second dielectric layer over at least a portion of the charge-trapping layer, the second dielectric layer having a highly-amorphous material and characterized by a crystallization temperature above which the second dielectric layer becomes substantially non-amorphous, the crystallization temperature being lower than the diffusion temperature, and forming a gate contact layer coupled to the charge-trapping layer via the second dielectric layer.

In accordance with another embodiment of the invention, a charge-trapping memory cell is provided, including a first source/drain junction and a second source/drain junction, a channel region between the first source/drain junction and the second source/drain junction, a charge-trapping layer arrangement above the channel region, the charge-trapping layer arrangement including a first dielectric layer, a charge-trapping layer above the first dielectric layer, a second dielectric layer above the charge-trapping layer, the second dielectric layer having a highly-amorphous material having a crystallization temperature above which the second dielectric layer becomes substantially non-amorphous, the crystallization temperature being lower than the activation temperature of the first source/drain junction and the second source/drain junction.

The second dielectric layer may include a material selected from the group consisting of amorphous aluminum oxide ($Al_2O_3$), amorphous hafnium oxide ($HfO_2$), and amorphous zirconium oxide ($ZrO_2$).

The charge-trapping layer may include charge-trapping nanoprecipitates, which may have a diameter of less than several nanometers, e.g., less than 4 nm, in other words nanostructures. The nanoprecipitates may contain down to only one or only a few atoms. The nanoprecipitates may include an implant selected from a group of materials consisting of germanium (Ge), silicon (Si), boron (B), carbon (C), aluminum (Al), gallium (Ga), titanium (Ti), zirconium (Zr), niobium (Nb), hafnium (Hf), yttrium (Y), indium (In), lanthanum (La), tantalum (Ta), or tungsten (W).

In yet another embodiment of the invention, a non-volatile memory cell is provided, including a first source/drain junction and a second source/drain junction, a channel region between the first source/drain junction and the second source/drain junction, a gate layer arrangement above the channel region, a word line connected to the gate layer arrangement, the word line containing metal.

The metal may include a metal being selected from a group consisting of copper (Cu), aluminum (Al), silver (Ag), and gold (Au).

The mentioned metals have a resistivity of less than 10 µohmcm, e.g., of less than 6 µohmcm, e.g., of less than or equal to 5 µohmcm, in contrast to the conventional word line materials that have a resistivity of more than 10 µohmcm.

The gate layer arrangement may include a floating gate layer, a dielectric layer above the floating gate layer, and a control gate layer above the dielectric layer, thereby forming a floating gate memory cell.

In another embodiment of the invention, the gate layer arrangement includes a charge-trapping layer arrangement. The charge-trapping layer arrangement may include a first dielectric layer, a charge-trapping layer above the first dielectric layer, and a second dielectric layer above the charge-trapping layer.

As used herein the terms connected and coupled are intended to include both direct and indirect connection and coupling, respectively.

FIG. 1 shows a simplified memory system 100. The memory system 100 includes a memory controller 102, e.g., a microprocessor, and a memory device 104. In the embodiments described, the memory device 104 is configured as an integrated circuit flash memory device that includes a memory field 106 of a plurality, e.g., thousands or millions of flash memory cells. The memory field 106 can include the flash memory cells in any kind of architecture. In accordance with one embodiment of the invention, the flash memory cells are arranged in the field 106 in one or more arrays in rows and columns. Furthermore, the flash memory cells are connected with one another and with a control circuitry in accordance with a NAND architecture. Furthermore, the memory device 104 includes an address decoder 108, a row access circuit 110 and a column access circuit 112. The memory cells store data that are accessed via an input/output interface 114 and a data connection 116, e.g., a data bus, by the memory controller 102. Furthermore, a control connection 118, e.g., a control bus, and an address connection 120, e.g., an address bus, are provided. Memory cell address signals are transmitted via the address connection 120 and are decoded in the address decoder 108. The operations are carried out according to control signals that are transmitted from the memory controller 102 via the control connection 118.

In an alternative embodiment of the invention, the flash memory cells are connected with one another and with a control circuitry in accordance with a NOR architecture.

It will be appreciated by those skilled in the art that additional components and electronic circuits can be provided, and that the memory system 100 has been simplified in order to help to focus on the invention.

FIG. 2 illustrates a NAND memory array 200 as a part of the memory device 104 in accordance with one embodiment of the invention. The memory array 200 includes word lines 202 (in general, an arbitrary number of word lines 202, in one embodiment of the invention, 1024 word lines 202) and intersecting local bit lines 204 (in general, an arbitrary number of local bit lines 204, in one embodiment of the invention, 512 local bit lines 204). The local bit lines 204 are connected to global bit lines (not shown in FIG. 2).

The memory device 104 includes NAND strings 206, each NAND string 206 having charge storage transistors 208, e.g., floating gate transistors or charge-trapping transistors. Any kind of non-volatile memory cell can be provided in the NAND string 206. Furthermore, an arbitrary number of charge storage transistors 208 can be provided in the NAND string 206, in accordance with one embodiment of the invention, 32 charge storage transistors 208. The charge storage transistors 208 are connected in series source-to-drain between a source select gate 210, which may be implemented as a field effect transistor, and a drain select gate 212, which may also be implemented as a field effect transistor. Each source select gate 210 is positioned at an intersection of a local bit line 204 and a source select line 214. Each drain select gate 212 is positioned at an intersection of a local bit line 204 and a drain select line 216. The drain of each source select gate 210 is connected to the source terminal of the first charge storage transistor 208 of the corresponding NAND string 206. The source of each source select gate 210 is connected to a common source line 218. A control gate 220 of each source select gate 210 is connected to the source select line 214.

In one embodiment of the invention, the common source line 218 is connected between source select gates 210 for NAND strings 206 of two different NAND arrays. Thus, the two NAND arrays share the common source line 218.

In an exemplary embodiment of the invention, the drain of each drain select gate 212 is connected to the local bit line 204 of the corresponding NAND string 206 at a drain contact 222. The source of each drain select gate 212 is connected to the drain of the last charge storage transistor 208 of the corresponding NAND string 206. In one embodiment of the invention, at least two NAND strings 206 share the same drain contact 222.

In accordance with the described embodiments, each charge storage transistor 208 includes a source 224, a drain 226, a charge storage region 228 (e.g., a floating gate region or a charge-trapping region) and a control gate 230. The control gate 230 of each charge storage transistor 208 is connected to a respective word line 202. A column of the NAND memory array 200 includes a respective NAND string 206 and a row of the NAND memory array 200 includes those charge storage transistors 208 that are commonly connected to a respective word line 202.

Different embodiments of the charge storage transistors 208 as well as different methods of manufacture of the NAND memory array 200 will be described in more detail below.

In one embodiment of the invention, a charge-trapping memory cell 208 includes a first (bottom) oxide layer, a nitride (middle) charge-trapping layer, and second (top) oxide layer, this structure being known as an ONO stack. The top oxide layer can be formed in a variety of different oxides, e.g., $SiO_2$, $Al_2O_3$, and others, each typically formed in the crystalline form of the oxide. $Al_2O_3$ is especially advantageous, as it provides a high dielectric constant k (8-10), which permits a strong coupling field between the charge-trapping layer and the gate electrode, and accordingly reduces the erase/programming voltage on or above the gate electrode.

Implementation of a polycrystalline $Al_2O_3$ top layer would be problematic, as it typically provides a structure with grains and grain boundaries around them. The latter may deteriorate the high isolation properties of high bandgap insulators, as the grain boundaries provide preferred conduction paths for the charge carriers. Thus, leakage currents may be driven through the insulator layer with the consequences of a low effective barrier height between the charge-trapping layer and the gate contact. In general, the amorphous state is a kinetically inhibited, "a frozen in" metastable thermodynamic state that tends to transform into the crystalline state if both the temperature and/or the available time are large enough for the system to relax into the state of lower energy, the crystalline state. In particular, when thin layers of $Al_2O_3$ are deposited in an atomic layer deposition system, they are found to be in a perfect amorphous state as can be seen, e.g., from a transmission electron microscope image. If it is exposed to relatively high temperatures, its amorphous structure may begin to transition to a less amorphous structure, i.e., a structure where islands of crystallites are found in a matrix of randomly arranged—amorphous—atoms. This change results in the formation of grain boundaries, through which charge may flow.

During an erase operation of a cell, for example, holes are injected from the gate channel into the charge-trapping layer due to a negative voltage applied on the gate electrode/word line. There, these holes recombine with the trapped electrons, which results in a net reduction of the programmed charge in the trapping layer. The recombination of the trapped charge within the charge-trapping layer may be negated if the top $Al_2O_3$ layer permits electron flow from the gate electrode, through the aforementioned grain boundaries, into the charge-trapping layer, preventing proper charge reduction in the cell to indicate erasure. $Al_2O_3$ top oxide layer exhibits this transitional amorphous-crystalline state phase leading to the formation of grain boundaries when the $Al_2O_3$ layer is temporarily heated to temperatures in the range of 800 to 1,050° C., this temperature range being the conventional annealing range of the source/drain junctions of the memory cell, to which the $Al_2O_3$ layer is exposed. Typical annealing times for these transitions are found to be more or less the same as those necessary during the conventional manufacturing process being one minute or even less if the temperature is in the aforementioned range. Accordingly, memory cells constructed using conventional techniques typically exhibit leakage through the top oxide layer.

In one embodiment of the invention, a charge-trapping memory cell and method of manufacture are provided, which do not suffer from the grain boundary formation and top oxide layer leakage.

In one embodiment of the invention, a charge-trapping memory cell for use in memory arrays is provided, which employs an amorphous top oxide layer. The amorphous top oxide layer exhibits a high barrier height, such that electron flow is inhibited between the charge-trapping layer and the word line/gate contact layer during memory cell operations. The amorphous characteristic of the top oxide layer provides a high barrier height between the gate conductor layer and the charge-trapping layer, which inhibits electron flow between the charge-trapping layer and the gate contact layer. Formation of the memory cell is such that the amorphous second dielectric layer, i.e., the top oxide layer, is not exposed to temperatures higher than its crystallization temperature, thereby preserving its amorphous characteristics and high barrier height.

Figure 3A:
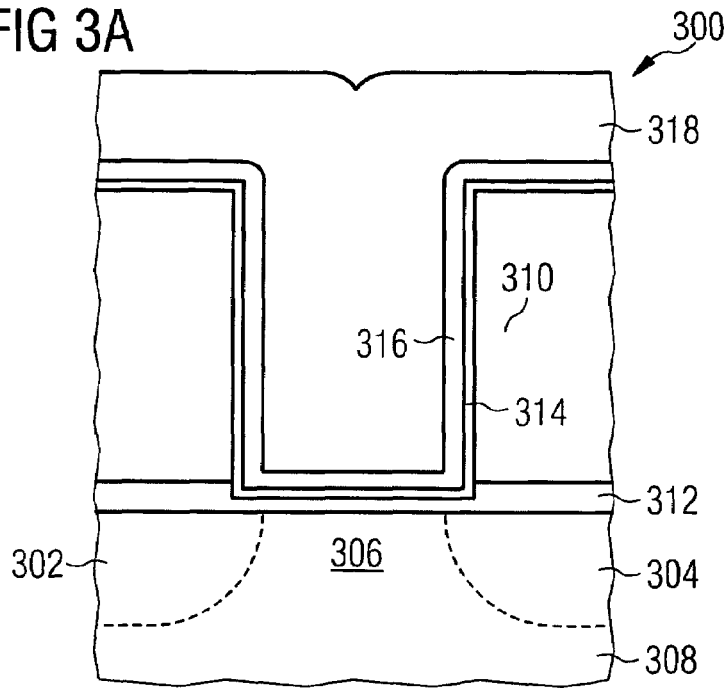
FIG. 3A illustrates a charge-trapping memory cell in accordance with one embodiment of the present invention.

FIG. 3A illustrates a charge-trapping memory cell 300 in accordance with one embodiment of the present invention. The view illustrates a cross-sectional view of the memory cell 300 composed of a first source/drain junction 302 and a second source/drain junction 304, and a channel region 306 formed within an implanted well of a bulk semiconductor substrate 308. In one embodiment, the memory cell 300 includes an n-channel device, in which case the first source/drain junction 302 and the second source/drain junction 304 are implanted n-type junctions, extending, for example, 20 nm to 40 nm below the surface of the bulk substrate 308. Of course, the memory cell 300 may consist of a p-channel device, in which case the first source/drain junction 302 and the second source/drain junction 304 will be implanted p-type junctions. The junctions may be slightly modified by implantations, such as lightly doped drain (LDD) and halo implants, which are known to improve short channel behavior.

In one embodiment of the invention, the first source/drain junction 302 and the second source/drain junction 304 are implanted before the formation of a gate structure 310. Further, the first source/drain junction 302 and the second source/drain junction 304 may include a dopant implant of a pre-defined impurity profile, whereby the impurity profile is characterized by a diffusion temperature (e.g., 850° C.), above which the dopant profile begins to diffuse. In order to avoid the diffusion of the impurity profile, the subsequent processes of forming the gate structure 310 are performed at temperatures below this diffusion temperature.

The channel region 306 optionally includes an enhancement implant, such as a halo implant or an LDD implant (as stated before) to enhance the channel doping concentration. For example, the end portions of the channel region 306 of an n-channel device may include a halo implant including a p-type doping, which is slightly higher than that of the p-well. Similarly, an n-type halo implant may be employed at the end portion of a channel region 306 of a p-channel device, the implanted halo having a slightly higher doping concentration than the n-well in the channel region 306. Additionally, the first well of the memory device 300 (e.g., a p-well) may be formed within a second well (e.g., an n-well), thereby forming a triple well structure.

The gate structure 310 includes a first dielectric layer 312 and a charge-trapping layer 314 coupled to the channel region 306 via the first dielectric layer 312. In one embodiment of the invention, the first dielectric layer 312 (gate/tunnel oxide layer) is a thermally grown oxide, although other deposition techniques and/or materials may be used in alternative embodiments of the invention. Furthermore, the first dielectric layer thickness may range from 3 nm to 15 nm, as will be further illustrated and described below.

The charge-trapping layer 314 may include a variety of materials, such as silicon nitride, at various thickness, e.g., 3 nm to 10 nm, and may be formed in either a single continuous section, or multiple sections in accordance with the invention. Further, the charge-trapping layer 314 may include either a substantially homogenous composition, e.g., Si-rich SiN, or include a composition of charge-trapping nanoprecipitates. Each of these embodiments is shown and described below.

The gate structure 310 further includes an amorphous second dielectric layer 316 formed above at least a portion of the charge-trapping layer 314. Examples of the second dielectric layer 316 include amorphous $Al_2O_3$, $Ta_2O_5$, $HfO_2$, $ZrO_2$, $SiO_2$, or combinations thereof and other largely-amorphous materials available in the particular fabrication process used. The term "highly amorphous" will be evident to those skilled in the art in comparison to crystalline state materials, although quantitatively, "highly amorphous" can be said to refer to a material in which less than 15 percent of the volume fraction is in an ordered (i.e., crystalline) state, an exemplary range being less than 10 percent, another exemplary range being less than 5 percent, and another exemplary range being less than 2 percent. The highly-amorphous property of the second dielectric layer 316 creates a high reverse barrier height between a gate conductor layer 318 and the charge-trapping layer 314, which inhibits the transfer of charge between the charge-trapping layer 314 to the gate contact layer 318. As noted above, the highly-amorphous second dielectric layer 316 is characterized by a crystallization temperature, above which the second dielectric layer 316 begins to become substantially non-amorphous, or in one embodiment, exhibits an ordered state in greater than 15 percent of its volume fraction. The temperature range of crystallization will depend largely upon the temperature and the duration over which the temperature is applied. As an example, the crystallization temperature for $Al_2O_3$ may range from 700 to 1000° C. For practical cases, in which the annealing time is less than 10 seconds, significant crystallization of $Al_2O_3$ is observed above 800° C.

The gate structure 310 further includes the gate contact layer 318 coupled to the charge-trapping layer 314 via the second dielectric layer 316. In one embodiment of the invention, the gate conductor layer 318 may include either n-doped or p-doped gate conductor material. Use of a p-doped gate conductor material with an n-type memory cell provides advantages to further inhibit charge flow between the gate conductor layer 318 and the charge-trapping layer 314, in that the barrier height therebetween is further increased by approximately 1 eV.

Figure 3B:
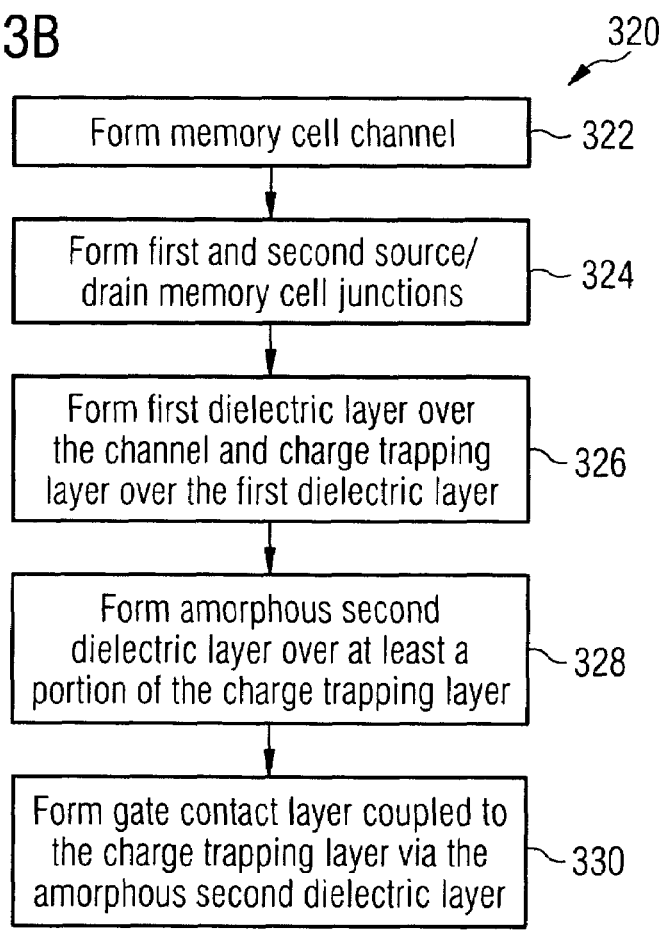
FIG. 3B illustrates an exemplary method for manufacturing a charge-trapping memory cell in accordance with the present invention.

FIG. 3B illustrates an exemplary method for manufacturing a charge-trapping memory cell in accordance with the present invention in a flow diagram 320.

At 322, a channel region 306 is formed. The process of forming the channel region 306 may include implanting halo/enhancement implants, as described above.

At 324, a first source/drain junction 302 and a second source/drain junction 304 are implanted and annealed ahead of the formation of an amorphous second dielectric layer 316.

Next, at 326 to 330, a gate structure of the memory cell 300 is formed, the gate structure formation process including the formation of a first dielectric layer 312, a charge-trapping layer 314, a second dielectric layer 316, and a gate conductor 318.

In exemplary embodiments, process 326 includes growing the first dielectric layer 312 over the channel region 306 to a particular thickness (e.g., 6 nm to 15 nm), and subsequently etching down to arrive at a desired thickness (e.g., 1.5 nm to 5 nm) for the charge-trapping memory cell. Process 326 further includes forming a charge-trapping layer 314 over the first dielectric layer 312 to provide the shortest coupling path to the channel 306, although in other embodiments, the charge-trapping layer 314 may not extend completely over the first dielectric layer 312.

In a first embodiment of forming the charge-trapping layer 314, one or more species of impurities e.g., B, C, Si, Al, Ga, Ge, Ti, Zr, Nb, Y, In, La, Ta, W is implanted into the charge-trapping layer 314, and the charge-trapping layer 314 is annealed prior to formation of the amorphous second dielectric layer 316 and at a predefined temperature below the diffusion temperature of the source/drain junctions 302, 304. In the aforementioned exemplary embodiment, in which the source/drain annealing temperature is above 850° C., the charge-trapping layer annealing temperature will range from 500 to 800° C. Through annealing the charge-trapping layer 314, a distribution of nanoprecipitates is formed within the charge-trapping layer 314 using plasma doping (e.g., using less than 1 keV acceleration voltage), thereby forming densely packed charge storage areas. In one embodiment of the invention, the anneal temperature (e.g., 600 to 700° C.) is such that a non-stoichiometric distribution of the nanoprecipitates is formed to further enhance formation of high density charge storage areas. Exemplary processes for forming the charge-trapping layer 314 are shown and illustrated below.

In a second embodiment of forming the charge-trapping layer 314, after formation of the amorphous dielectric layer 316 over the charge-trapping layer 314, the charge-trapping layer 314 is annealed at a predefined temperature, which is below both (i) the crystallization temperature of the amorphous second dielectric layer 316, and (ii) the diffusion temperature of the source/drain junctions 302, 304. Thermal activation causes the silicon atoms in the silicon rich SiN layer to form clusters of atoms in the sub-nm scale. In the aforementioned exemplary embodiment in which the crystallization temperature of the amorphous second dielectric layer 316 is 800 to 1000° C., and the source/drain annealing temperature is above 850° C., the charge-trapping layer annealing temperature will range from 500 to 800° C. Exemplary processes for forming the charge-trapping layer 314 are shown and illustrated below.

An exemplary embodiment of process 328 includes depositing the amorphous second dielectric layer 316 over the charge-trapping layer 314 to provide the shortest coupling path between the charge-trapping layer 314 and the gate contact layer 318. In the exemplary embodiment, in which the charge-trapping layer 314 is annealed, formation of the amorphous second dielectric layer 316 is performed subsequently, so as to not disturb the amorphous state of the second dielectric layer 316. Exemplary embodiments of this process are shown and described below.

An exemplary embodiment of process 330 includes depositing the gate conductor layer 318 over the second dielectric layer 316 to provide the shortest coupling path to the charge-trapping layer 314. The gate conductor layer 318 may be either an n-doped or a p-doped gate conductor, as described herein. Exemplary embodiments of this process are shown and described below.

FIG. 4A illustrates a first specific embodiment of a charge-trapping memory cell 400 in accordance with one embodiment of the present invention, with previously identified features retaining their reference numerals. In this embodiment of the invention, the first dielectric layer 312 is formed (e.g., thermally grown) to a relative large thickness, for example, 8 nm to 10 nm. A relatively thick first dielectric layer 312 has two advantages: (i) the thickness can be optimized to meet the voltage requirements of the select gates, which extends the service lifetime and (ii) the thick first dielectric layer 312 has a sufficient thickness to be reduced during certain cleaning steps, which are required in subsequent manufacturing and which remove at least one nanometer of oxide per step. The thickness can be adjusted (by wet chemical etching) to meet the optimum between erase efficiency and data retention, corresponding to values between 2.5 nm and 4 nm.

The charge-trapping layer 314 is constructed using several processes. First the charge-trapping layer 314 (which may be SiN, or similar materials used for charge-trapping layers, e.g., the material described above) is formed over at least a portion of the first dielectric layer 312. The thickness over at least a portion of the first dielectric layer 312 is between 3 nm and 8 nm. Next, the charge-trapping layer 314 is implanted using a method with a very shallow penetration depth which is no more than the thickness of the charge-trapping layer 314 (e.g., 1 nm to 3 nm). One or more impurities, such as Ge, Si and similar materials available in the particular fabrication process are used. The implanted charge-trapping layer 314 is next annealed to form nanoparticles within the implanted charge-trapping layer 314. The distribution of nanoparticles provides a high charge-trapping density (e.g., in the order of $1 \times 10^{19}/cm^3$) that enables a wide programming window for two, three or more threshold voltage levels for multi-bit operation. In a particular embodiment, the charge-trapping layer 314 is annealed to form a non-stoichiometric distribution of nanoparticles within the charge-trapping layer 314. In such an instance, local variations of the composition are formed in the lower range of annealing temperatures. Raising this temperature further creates the nanoparticles out of the variations of the composition, further increasing the trapping densities in those areas.

The high trapping density provided by the nanoparticles in the charge-trapping layer 314 further allows a reduction in the thickness of the charge-trapping layer 314, e.g., from 15 nm down to 3 nm to 7 nm, as sufficient charge is provided within a smaller volume of the charge-trapping layer 314. A reduction in the thickness of the charge-trapping layer 314 further enables the use of a lower erase voltage (e.g., 10 V to 15 V in comparison to 20 V), as the reduced thickness of the charge-trapping layer 314 results in a sufficient erase field (e.g., 1.3 V/nm) applied to the first dielectric layer 312 when the lower erase voltage is applied at the gate contact layer 318.

In one embodiment of the invention, the temperature used to form nanoparticles in the implanted charge-trapping layer 314 (e.g., 500 to 800° C.) is below the source/drain junction annealing temperature (e.g., higher than 850° C.). While the annealing temperature is sufficient to produce nanoparticles in the charge-trapping layer 314 (and in a particular embodiment, a non-stoichiometric distribution of the nanoparticles), it does not exceed the diffusion temperature of the source/drain implants in the source/drain junctions 302, 304. Accordingly, the implanted dopant profiles of the source/drain junctions 302 and 304 remain substantially unchanged with little diffusion after the charge-trapping layer annealing processes. The reduction in the source/drain junction diffusion provides greater accuracy in forming the respective source/drain and gate region areas of the cell, thereby allowing for the implementation of smaller cell structures, and accordingly, higher density arrays.

Further in this embodiment, the amorphous second dielectric layer 316 is formed after the aforementioned charge-trapping layer annealing process. In such an embodiment, no subsequent high temperature steps are performed, and the amorphous state of the second dielectric layer 316 is retained upon its formation. The gate contact layer 318 is subsequently provided, either in the form of n-doped material or p-doped material, as will be further illustrated below.

FIG. 4B illustrates a second specific embodiment of a charge-trapping memory cell 450 in accordance with one embodiment of the present invention, with previously identified features retaining their reference numerals. As in the first embodiment, the first source/drain junction 302 and the second source/drain junction 304 include implants which are characterized by a diffusion temperature, above which the implants begin to diffuse. The source/drain junctions 302, 304 are implanted and annealed before the amorphous second dielectric layer 316 is formed, and in one embodiment, before the charge-trapping layer 314 is formed.

Further exemplary of this embodiment, the first dielectric layer 312 is initially formed (e.g., thermally grown) to a first thickness, for example, 5 nm to 15 nm, and subsequently etched down to a desired thickness, for example 3 nm. This process permits the parallel construction of transistors having different threshold voltages, such as memory cells and select gate transistors, as will be shown below.

The charge-trapping layer 314 is composed of a largely homogenous charge-trapping layer material, such as Si-rich silicon nitride. Other materials may be alternatively used, for example Ge-rich silicon nitride. The charge-trapping layer 314 may be formed in thicknesses ranging from 3 nm to 10 nm using atomic layer deposition, low pressure chemical vapor deposition (LPCVD), or other techniques available with the particular fabrication process used.

The amorphous second dielectric layer 316 is generally deposited over the charge-trapping layer 314, and subsequently the charge-trapping layer 314 is annealed at a predefined temperature that is below both (i) the crystallization temperature of the amorphous second dielectric layer 316, and (ii) the diffusion temperature of the source/drain junctions 302, 304. In the aforementioned exemplary embodiment, in which the crystallization temperature of the amorphous second dielectric layer 316 is 800 to 1000° C., and the source/drain annealing temperature is above 850° C., the charge-trapping layer annealing temperature will range from 500 to 800° C.

The gate conductor layer 318 (which may be n-doped or p-doped gate conductor material) is deposited over the amorphous second dielectric layer 316 to provide the shortest coupling distance to the charge-trapping layer 314. In a particular embodiment, the memory cell 450 is an n-type device and the gate conductor is a p+ conductor material to provide a 1 eV higher barrier to further inhibit charge transfer between the charge-trapping layer 314 and the gate conductor layer 318.

As shown in FIG. 4B, nanoparticles 452, which are produced as described above, are provided in the charge-trapping layer 314 so as to provide a high charge-trapping density (e.g., in the order of $1 \times 10^{19}/cm^3$) that enables a wide programming window for two, three or more threshold voltage levels for multi-bit operation.

Figure 5:
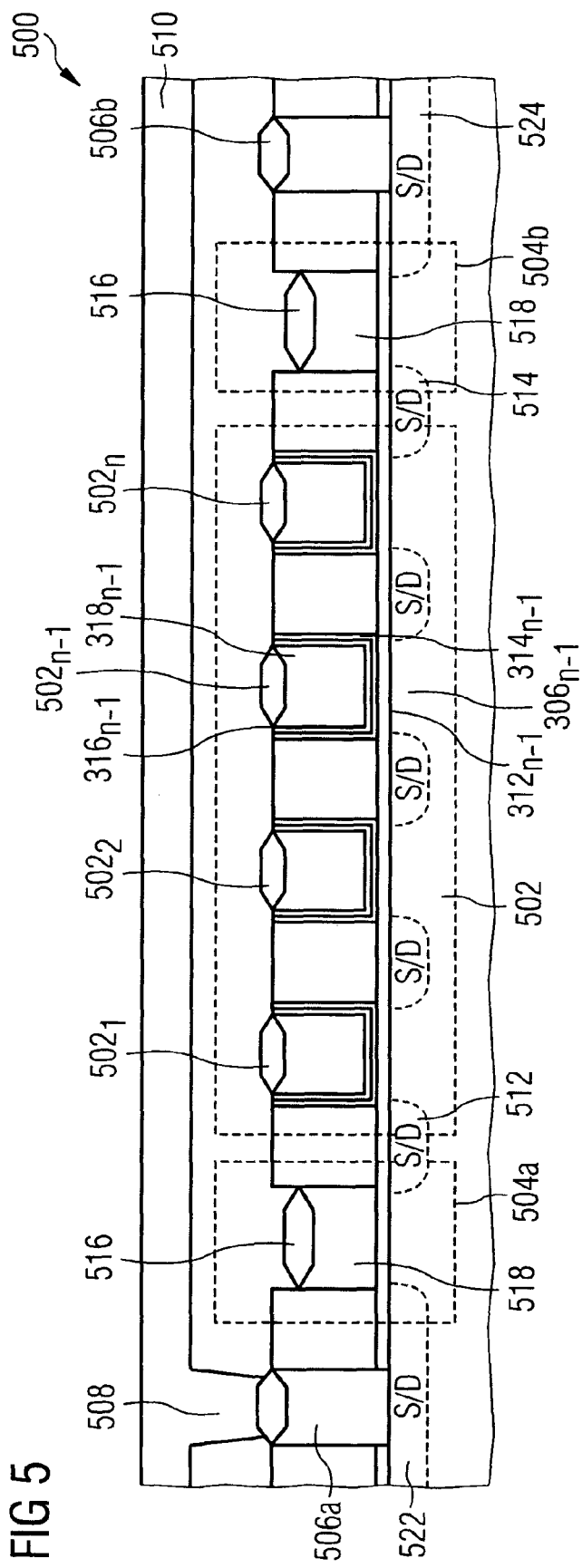
FIG. 5 illustrates a cross-sectional view of an exemplary NAND array portion of charge-trapping memory cells in accordance with one embodiment of the present invention.

FIG. 5 illustrates a cross-sectional view of an exemplary NAND array portion 500 of charge-trapping memory cells in accordance with one embodiment of the present invention. The NAND array portion 500 includes a NAND string of source-to-drain coupled charge-trapping memory cells $502_1$, $502_2$, ..., $502_{n-1}$, $502_n$, a first select gate cell 504a and a second select gate cell 504b, a first bit line contact 506a and a second bit line contact 506b, a bit line via 508, and a bit line 510. Word lines coupling to each of the charge-trapping memory cells $502_1$, $502_2$, ..., $502_{n-1}$, $502_n$ consist of the interconnection of the gate contacts. In addition, the second bit line contacts 506b are coupled to a source line common to adjacent strings, also referred to as the common source line, which may be connected to ground potential.

As shown, the NAND string 500 includes a plurality of source-to-drain coupled charge-trapping memory cells $502_1$, $502_2$, ..., $502_{n-1}$, $502_n$, each of which being constructed as described above. In particular, each of the memory cells $502_1$, $502_2$, ..., $502_{n-1}$, $502_n$ includes first and second source/drain junctions (labeled as S/D), and a channel region $306_1$, $306_2$, ..., $306_{n-1}$, $306_n$ between a respective first source/drain junction and second source/drain junction. Furthermore, a gate structure is provided above the channel region $306_1$, $306_2$, ..., $306_{n-1}$, $306_n$, the gate structure having a first dielectric layer $312_1$, $312_2$, ..., $312_{n-1}$, $312_n$ and a charge-trapping layer $314_1$, $314_2$, ..., $314_{n-1}$, $314_n$ coupled to the channel region $306_1$, $306_2$, ..., $306_{n-1}$, $306_n$ via the first dielectric layer $312_1$, $312_2$, ..., $312_{n-1}$, $312_n$. A gate contact layer $318_1$, $318_2$, ..., $318_{n-1}$, $318_n$ is coupled to the charge-trapping layer $314_1$, $314_2$, ..., $314_{n-1}$, $314_n$ via a second dielectric layer $316_1$, $316_2$, ..., $316_{n-1}$, $316_n$, the second dielectric layer $316_1$, $316_2$, ..., $316_{n-1}$, $316_n$ including a highly-amorphous material characterized by a crystallization temperature, above which the second dielectric layer becomes substantially non-amorphous (the charge-trapping memory cell elements in FIG. 5 are designated with reference numerals only for the (n-1)th charge-trapping memory cell $502_{n-1}$). As described above, the first dielectric layer $312_1$, $312_2$, ..., $312_{n-1}$, $312_n$ may be formed to different thicknesses. Additionally, the charge-trapping layer $314_1$, $314_2$, ..., $314_{n-1}$, $314_n$ may be implanted and annealed to form charge-trapping nanoparticles therein. Further exemplary, the gate contact layer $318_1$, $318_2$, ..., $318_{n-1}$, $318_n$ may include either n-doped or p-doped gate conductor material. The manufacturing process is further illustrated below.

Further included in the exemplary NAND memory array 500 are select gate cells 504a, 504b, operable to provide appropriate bit line voltages to each side of the NAND string 502. Two select gate cells 504a, 504b are shown in the illustrated embodiment, a first select gate cell 504a coupled to the first memory cell $502_1$ and a second select gate cell 504b coupled to the n-th memory cell $502_n$ of the NAND string 502. In an alternative embodiment, only one select gate cell may be employed, e.g., when a source line is used to supply a voltage to one side of the NAND string 502.

As shown, the select gate cells 504a and 504b are coupled to the memory cells $502_1$ and $502_n$ in a series-coupled source-to-drain arrangement, each of the select gate cells 504a and 504b having first source/drain junctions 512 and 514 coupled to a source/drain junction of an adjacent memory cell $502_1$, $502_n$. Each of the select gate cells 504a, 504b further includes a gate structure 516 operable to control the state of the select gate cells 504a and 504b.

In one embodiment of the invention, the gate contact layer $318_1, 318_2, \ldots, 318_{n-1}, 318_n$ of at least one of the charge-trapping memory cells $502_1, 502_2, \ldots, 502_{n-1}, 502_n$ is composed of a first conductor material operable to provide a first gate work function, and the gate contact layer 518 of at least one of the select gate cells 504a and 504b is composed of a second conductor material that may be operable to provide a second gate work function. In one embodiment of the invention, the gate contact layer $318_1, 318_2, \ldots, 318_{n-1}, 318_n$ of each of the charge-trapping memory cells $502_1, 502_2, \ldots, 502_{n-1}, 502_n$ is composed of p-doped polysilicon operable to provide a high gate work function, and the gate contact layer 518 of each of the select gate cells 504a, 504b may be composed of n-doped polysilicon for providing a low gate work function. By using a high work function gate material in the construction of the memory cells, the barrier height between the charge-trapping layer $314_1, 314_2, \ldots, 314_{n-1}, 314_n$ and the gate contact layer $318_1, 318_2, \ldots, 318_{n-1}, 318_n$ can be increased. Those skilled in the art will appreciate that the gate contact layer $318_1, 318_2, \ldots, 318_{n-1}, 318_n$ may also be formed from p+ polysilicon operable to provide a high gate work function if so desired.

The NAND array portion 500 further includes the bit line contacts 506a and 506b, the bit line via 508, and the bit line 510. The bit line contacts 506a and 506b provide the contact interface to the select gate cells 504a and 504b, respectively, via second source/drain junctions 522 and 524 of the select gate cells 504a and 504b, respectively, the select gate cells 504a and 504b operable to switch the bit line voltage to the memory cells $502_1$ and $502_n$, respectively for activating the NAND memory cell string 502. Bit line via 508 provides contact between the first bit line contact 506a and the bit line 510.

FIG. 6A shows a flow diagram 600 illustrating an exemplary method of manufacturing a NAND array of charge-trapping memory cells in accordance with the present invention.

At 602, a channel region 306 for each memory cell is formed, wherein the process 602 optionally includes providing an enhancement implant, such as a halo implant or an LDD implant to enhance the channel doping concentration at the channel region end sections between the first and second source/drain junctions 302 and 304.

The method includes processes by which a plurality of source-to-drain coupled charge-trapping memory cells are formed, whereby first and second source/drain junctions for each of the memory cells are coupled (process 604).

In one embodiment of process 604 corresponding to the construction of a memory cell described in FIG. 4A, the source/drain junctions 302, 304 are implanted (providing a predefined dopant profile (n-type or p-type)) and annealed at a temperature above 850° C., thereby activating the doping atoms in the source/drain junctions 302, 304. A subsequent step in the formation of the charge-trapping layer 314 does not exceed the diffusion temperature of the source/drain junctions 302, 304.

At 606, a first dielectric layer 312 is formed on or above the upper surface of the substrate at least above the channel region 306 and a charge-trapping layer 314 is formed on or above the first dielectric layer 312. The first dielectric layer 312 is formed over the channel region 306, and grown/deposited at a relative large thickness, for example, 6 nm to 15 nm, as shown in the embodiment illustrated in FIG. 4A. In another embodiment, as described in FIG. 4B, the thick first dielectric layer is etched back to a thickness of 2 nm to 5 nm for the charge-trapping cells.

The charge-trapping layer 314 is grown/deposited over the first dielectric layer 312 to provide the shortest coupling path to the channel region 306, and may be formed either as a single continuous section, or as multiple sections.

A specific embodiment of process 606 corresponding to the manufacture of the cell shown in FIG. 4A includes the processes of forming the charge-trapping layer 314 over at least a portion of the first dielectric layer 312, implanting the charge-trapping layer 314 with one or more impurities, annealing the implanted charge-trapping layer 314 to a temperature operable to form charge-trapping nanoprecipitates therein. The implanted impurities may be selected from the group consisting of Ge, Si, B, C, Al, Ga, Ti, Zr, Nb, Hf, Y, In, La, Ta, W and similar materials available to the particular fabrication process employed. In one embodiment of the invention, the temperature to which the implanted charge-trapping layer 314 is annealed is sufficient to form a non-stoichiometric distribution of nanoparticles to further concentrate the trapping density of the charge-trapping layer 314. In such an instance, local variations of the composition are formed in the lower range of annealing temperatures. Raising this temperature further creates the nanoparticles out of the variations of the composition, further increasing the trapping densities in those areas.

In an embodiment of process 606 consistent with the formation of the memory cell in FIG. 4B, formation of the charge-trapping layer 314 includes depositing a largely-homogenous charge-trapping layer 314 over the first dielectric layer 312, and annealing the charge-trapping layer 314 at a predefined temperature after the amorphous second dielectric layer 316 is formed over the charge-trapping layer 314. In this embodiment, the charge-trapping layer annealing temperature is below both (i) the crystallization temperature of the amorphous second dielectric layer 316, and (ii) the diffusion temperature of the source/drain junctions 302, 304.

At 608, an amorphous second dielectric layer 316 is formed over at least a portion of the charge-trapping layer 314. In a specific embodiment, the second dielectric layer 316 is composed of amorphous $Al_2O_3$, $Ta_2O_5$, $HfO_2$, $ZrO_2$, $SiO_2$, or combinations thereof. Furthermore, the second dielectric layer 316 is characterized by a crystallization temperature (e.g., 800 to 1000° C.), above which the second dielectric layer 316 material becomes substantially non-amorphous. In a first embodiment consistent with that of the memory cell 400 in FIG. 4A, the amorphous second dielectric layer 316 is formed after the annealing process of the charge-trapping layer 314. In a second embodiment consistent with that of the memory cell 450 in FIG. 4B, the amorphous second dielectric layer 316 is formed before the charge-trapping layer annealing process.

At 610, a gate contact layer 318 is formed coupled to the charge-trapping layer 314 via the second dielectric layer 316. In a specific embodiment, the gate contact layer 318 is formed over the second dielectric layer 316 so as to provide the shortest coupling path thereto. In a specific embodiment, the gate contact layer 318 is formed of n-doped or p-doped material to provide a tunable gate workfunction.

At 612, at least one select gate cell 504a, 504b is formed coupled to the NAND string 502 of memory cells. The process includes forming first and second source/drain junctions 512, 514 and 522, 524, wherein one of the first or second source/drain junctions 512, 514 and 522, 524 of the select gate cell is coupled to the one of the first or second source/drain junctions 302 or 304 of one of the plurality of charge-trapping memory cells $502_1, 502_2, \ldots, 502_{n-1}, 502_n$. Further, a gate structure 516 is formed above the channel region of the select gate cells 504a, 504b, the channel region being coupled between the first and second source/drain junctions of the select gate cell 504a, 504b.

In one embodiment of the invention, the NAND string memory cells $502_1, 502_2, \ldots, 502_{n-1}, 502_n$ and the select gate cell(s) 504a, 504b are formed with different gate contact layers, such that these two cell types exhibit different gate workfunctions. For example, the gate contact layer of n-channel charge-trapping memory cells may be composed of p+ gate conductor material (e.g., p-doped polysilicon) to provide a high barrier height between the charge-trapping layer 314 and gate contact layer 318, whereas the gate contact layer 318 of the n-channel select cells 504a, 504b may be composed of n+ gate conductor material (e.g., n-doped polysilicon) to provide low gate workfunction for low voltage switching. Alternatively, the materials used for the gate contact layers may be switched to provide a low gate workfunction memory cells and high gate workfunction select gates. Materials other than polysilicon, e.g., metals, may be employed to provide the differing gate workfunctions as well.

FIGS. 6B to 6K illustrate a cross-sectional view of the NAND array portion 500 in various states of manufacture in accordance with an embodiment of the present invention. The view is of the NAND string illustrated in FIG. 5 after completion of various fabrication steps, as now described.

Initially active areas of NAND strings 620 are formed in the bulk semiconductor substrate 622 (e.g., Si, SiGe, GaAs, and the like), the active areas isolated by shallow trench isolation barriers (not shown in the figure). Next, the first dielectric layer 624 is formed (thermally grown as an example) over the active areas. In one embodiment of the invention, the first dielectric layer 624 is grown at a relative large thickness appropriate for the higher voltage cells in the NAND string 620, for example the select gate cells 504a, 504b. Next, the gate contact layers 626a and 626b for the select gate cells 504a, 504b are deposited (e.g., undoped or n+ polysilicon), and a SiN hardmask 628 deposited thereover. Sacrificial gate structures 630 of each of the NAND memory cells and gate structures of each of the select gate cells are masked and areas within the region, in which the charge-trapping memory cells are to be formed, are etched (e.g., using reactive ion etching; in general, any anisotropic etching can be used in this case), thereby exposing the upper surface of the first dielectric layer 624 in those areas, in which the source/drain regions 632 of the charge-trapping memory cells should be formed. In this way, sacrificial gate structures 630 are formed, which are located above the channel regions of the charge-trapping memory cells to be formed. Subsequently the exposed source/drain regions 632 are implanted with a predefined dopant profile using the sacrificial gate structures 630 and the gate structures of each of the select gate cells as mask. Then, the exposed source/drain regions are annealed, thereby activating the doping atoms. Certain liners and sidewall spacers (not shown) may be used to limit the lateral extension of the junctions to a certain length below the gate edges. The resulting structure is shown in FIG. 6B.

Next, open structures are filled with an oxide 634, and liners and spacers are employed to allow concurrent CMOS processing. Subsequently, the structure is planarized using a CMP process, and the SiN hardmask within the word line pattern is removed using a corresponding lithography mask. Additionally, the polysilicon portions within the word line pattern are also removed, which had been formed together with the deposition of the gate contact layers 626a and 626b for the select gate cells 504a, 504b. In other words, the sacrificial gate structures 630 are removed, which are located above the channel regions of the charge-trapping memory cells to be formed. The resulting structure is shown in FIG. 6C.

The NAND string memory cells $502_1, 502_2, \ldots, 502_{n-1}, 502_n$ are next formed in accordance with the embodiments described in FIG. 4A or 4B. In the manufacturing embodiment consistent with the memory cell structure shown in FIG. 4A, the charge-trapping layer 314 is formed over at least a portion of the first oxide layer 312, the charge-trapping layer 312 composed of, e.g., a Si-rich SiN material. Next, the charge-trapping layer 314 is implanted with one or more species of impurities, e.g., Si, Ge or similar materials. The implanted impurities in the charge-trapping layer 314 are subsequently annealed at a temperature below the diffusion temperature of the implanted profiles, thereby forming nano-precipitates, e.g., having a diameter of less than or equal to 4 nm, e.g., having a diameter of less than or equal to 3 nm, e.g., having a diameter of less than or equal to 1 nm, using plasma doping within the implanted charge-trapping layer 314. In one embodiment of the invention, the annealing temperature is selected such that the charge-trapping nanoprecipitates are formed in a non-stoichiometric distribution within the charge-trapping layer 314, e.g., 700 to 850° C., and is below the diffusion temperature of the source/drain junctions 302, 304. The amorphous second dielectric layer 316 is next formed over at least a portion of the charge-trapping layer 314, using, e.g., processes such as atomic layer deposition, low pressure CVD, or similar processes. The gate conductor layer 318 for the NAND memory cells $502_1, 502_2, \ldots, 502_{n-1}, 502_n$ is then deposited over the amorphous second dielectric layer 316, the gate conductor layer 318, in one embodiment, being composed of a gate conductor material (e.g., p+ doped polysilicon) operable to provide a different gate work function than that of the gate contact layers 626a and 626b of the select gate cells 504a, 504b. The resulting structure is shown in FIG. 6D.

In the manufacturing embodiment consistent with the memory cell structure shown in FIG. 4B, the thickness of the first oxide layer 312 is reduced to a conventional thickness of 2 nm to 5 nm, e.g., 3 nm. Next, the charge-trapping layer 314 is formed over at least a portion of the first oxide layer 312, the charge-trapping layer 314 composed of, e.g., a Si-rich SiN material. The amorphous second dielectric layer 316 is formed over at least a portion of the charge-trapping layer 314, using e.g., processes such as atomic layer deposition, low pressure CVD, or similar processes. The charge-trapping layer 314 is subsequently annealed at a temperature that is below both (i) the crystallization temperature of the amorphous second dielectric layer 316, and (ii) the diffusion temperature of the source/drain junctions 302, 304. The gate conductor layer 318 for the NAND memory cells $502_1, 502_2, \ldots, 502_{n-1}, 502_n$ is then deposited over the amorphous second dielectric layer 316, the gate conductor layer 318, in one embodiment, being composed of a gate conductor material (e.g., p+ doped polysilicon) operable to provide a different gate work function than that of the gate contact layers 626a and 626b of the select gate cells 504a, 504b. The resulting structure is shown in FIG. 6E.

The gate conductor layer 318 for the NAND memory cells $502_1, 502_2, \ldots, 502_{n-1}, 502_n$ is then partially removed using a CMP process, until the upper surfaces of the oxide 634 are exposed. Next, those portions of the SiN hardmask 628 that still remain on or above the gate contact layers 626a and 626b of the select gate cells 504a, 504b, is selectively removed. The resulting structure, which is the same for both memory cell structures according to FIG. 4A and FIG. 4B, is shown in FIG. 6F.

The conductivity of the gate contact layers 318 for the NAND memory cells $502_1$, $502_2$, ..., $502_{n-1}$, $502_n$ and the select gate cells 504a, 504b may be increased by a salicidation process. The resulting structure is shown in FIG. 6G.

Next, the areas outside of the first bit line contact to be formed are masked using a first bit line contact mask, and a first bit line contact hole 636 is etched. The etched first bit line contact hole 636 is filled with first bit line contact material (e.g., polysilicon) 638 and planarized, and the first bit line contact mask is removed, thereby forming a first bit line contact 640. Then, the first bit line contact material 638 may be salicided. Next, an intermetal dielectric layer 642 is deposited to cover the full structure and the intermetal dielectric layer 642 is planarized.

Next, the areas outside of the second bit line contact to be formed are masked using a second bit line contact mask, and a second bit line contact hole 644 is etched. The etched second bit line contact hole 644 is filled with second bit line contact material (e.g., polysilicon) 646 and planarized, and the second bit line contact mask is removed, thereby forming a second bit line contact 648. Bit lines 650 are formed in contact with the second bit line contact 648. The resulting structure is shown in FIG. 6H.

Figure 6H:
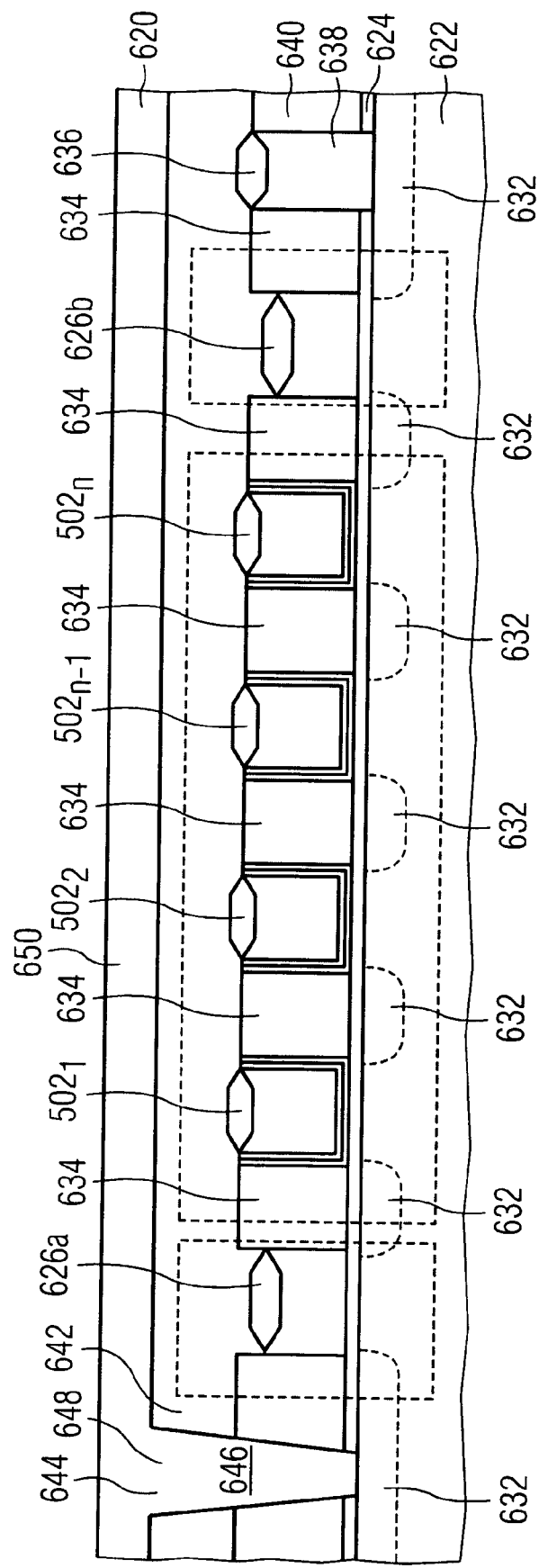

In an alternative embodiment to the processes described in FIG. 6F to FIG. 6H, prior to removing the SiN hardmask 628, the oxide areas 634 outside of the bit line contacts to be formed and outside the source lines to be formed are masked using a bit line contact/source line mask, and the bit line contact holes 652 within the oxide areas 634 are etched using a reactive ion etching. In addition, the source lines are etched using a reactive ion etching. The etched bit line contact holes 652 are filled with bit line contact material (e.g., polysilicon) 654 and planarized, thereby forming a first bit line contact 656 being connected to the source line and a partial second bit line contact 658, and the SiN hardmask 628 is selectively removed. The resultant structure is shown in FIG. 6I.

Following the processes of the alternative embodiment described in FIG. 6I, the conductivity of the gate contact layers for the NAND memory cells $502_1$, $502_2$, ..., $502_{n-1}$, $502_n$ and the select gate cells 504a, 504b is increased by a salicidation process. The resultant structure is shown in FIG. 6J.

Next, an intermetal dielectric layer 660 is deposited to cover the full structure of FIG. 6J and the intermetal dielectric layer 660 is planarized.

Next, the areas outside of the second bit line contact to be formed (which is above the second partial bit line contact) are masked using a bit line contact mask, and a third bit line contact hole 662 is etched, thereby exposing the upper surface of the partial second bit line contact 658. The third bit line contact hole 662 is filled with third bit line contact material (e.g., polysilicon) 664 and planarized, and the bit line contact mask is removed, thereby forming a second bit line contact 666. Bit lines 668 are formed in contact with the second bit line contact 666. The resultant structure is shown in FIG. 6K.

The embodiments of the invention described in the following are related to non-volatile memory devices such as those described above. By way of example, the embodiments of the invention described in the following are related to NAND flash non-volatile memory devices. A new structure is described that provides word lines with a low resistivity metal such as copper (Cu), aluminum (Al) or silver (Ag). In addition, process schemes will be described to manufacture such non-volatile memory devices having such word lines with improved resistivity to enable further scaling.

FIG. 7 illustrates a portion of a layout of a NAND array 700 in accordance with an embodiment of the invention. The NAND array 700 includes a plurality of non-volatile memory devices (not shown in FIG. 7), which are arranged in rows and columns and which are connected to each other in accordance to a NAND structure as described above with regard to the above-mentioned embodiments.

FIG. 7 shows the layout of three NAND strings 702, each including a plurality of non-volatile memory devices. The non-volatile memory devices of each NAND string 702 are arranged in respective active areas. The non-volatile memory devices of adjacent NAND strings 702 are electrically isolated from each other by means of shallow trench isolation (STI). The non-volatile memory devices of each NAND string 702 are source-to-drain-coupled to one another in a series connection as described with reference to FIG. 2 above. Bit line contacts 704 are provided connecting a respective local bit line 706 to a source/drain junction of a drain select gate, which may also be implemented as a field effect transistor. The drain select gate is connected to a drain select line 708 (also referred to as bit select line). In addition, a source select line 710 is provided at the end of the NAND strings 702 that is opposite to that end at which the bit select line 708 is provided. The source select line 710 is connected to the source select gate of each NAND string 702.

Each source select gate is positioned at an intersection of a local bit line 706 and a source select line 710. Each drain select gate is positioned at an intersection of a local bit line 706 and a drain select line 708. The drain of each source select gate is connected to the source terminal of the first charge storage transistor of the corresponding NAND string 702. The source of each source select gate is connected to a common source line 712. A control gate of each source select gate is connected to the source select line 710. The common source line 712 may be connected to ground potential. The common source line 712 interconnects the active areas of the NAND strings 702. NAND string word lines 714 are provided to provide a respective gate control signal to the non-volatile memory devices of a respective row of the NAND array 700. The number of NAND string word lines 714 corresponds to the number of non-volatile memory devices provided in each NAND string 702. In one embodiment of the invention, the NAND string word lines 714 are spaced apart from each other at a distance of the minimum feature size (F) of the respective process technology used.

Figure 8A:
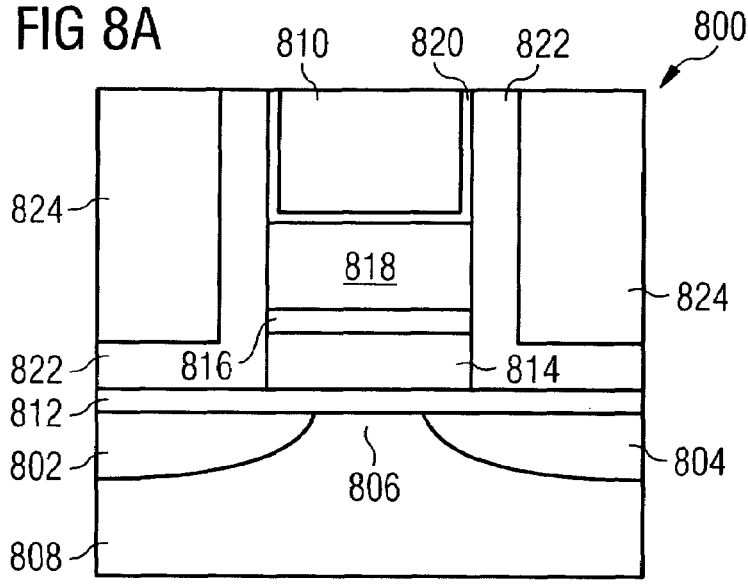
FIG. 8A illustrates a floating gate memory cell in accordance with one embodiment of the present invention.

FIG. 8A illustrates a floating gate memory cell 800 in accordance with one embodiment of the present invention. The view illustrates a cross-sectional view of the cell 800 composed of a first source/drain junction 802 and a second source/drain junction 804, and a channel region 806 formed within an implanted well of a bulk semiconductor substrate 808. In one embodiment, the floating gate memory cell 800 includes an n-channel device, in which case the first source/drain junction 802 and the second source/drain junction 804 are implanted n-type junctions, extending, for example, 20 nm to 40 nm below the surface of the bulk substrate 808. Of course, the floating gate memory cell 800 may consist of a p-channel device, in which case the first source/drain junction 802 and the second source/drain junction 804 will be implanted p-type junctions. The junctions may be slightly modified by implantations, such as lightly doped drain (LDD) and halo implants, which are known to improve short channel behavior.

In one embodiment of the invention, the first source/drain junction 802 and the second source/drain junction 804 are implanted and activated before the formation of the word line 810. Further, the first source/drain junction 802 and the second source/drain junction 804 may include a dopant implant of a predefined impurity profile, whereby the impurity profile is characterized by a diffusion temperature (e.g., 850° C.), above which the dopant profile begins to diffuse. As will be described in more detail below, forming the word lines 810 is performed at temperatures below this diffusion temperature, thereby enabling the usage of a high conductivity metal such as Cu, Al, Ag, Au, which has a melting point below the diffusion temperature.

The channel region 806 optionally includes an enhancement implant, such as a halo implant or an LDD implant (as stated before) to enhance the channel doping concentration. For example, the end portions of the channel region 806 of an n-channel device may include a halo implant including a p-type doping that is slightly higher than that of the p-well. Similarly, an n-type halo implant may be employed at the end portion of a channel region 806 of a p-channel device, the implanted halo having a slightly higher doping concentration than the n-well in the channel region 806. Additionally, the first well of the memory device 800 (e.g., a p-well) may be formed within a second well (e.g., an n-well), thereby forming a triple well structure.

A first dielectric layer 812 is provided on or above the main process surface of the semiconductor substrate 808 at least above the channel region 806. In one embodiment of the invention, the first dielectric layer 812 (tunnel dielectric layer) is a thermally grown oxide, although other deposition techniques and/or materials may be used in alternative embodiments of the invention. Furthermore, the first dielectric layer thickness may range from 3 nm to 15 nm, as will be further illustrated and described below.

A floating gate layer 814 is provided on or above the first dielectric layer 812. The floating gate layer 814 may include a variety of materials, such as polysilicon or other suitable material at various thicknesses, e.g., 10 nm to 200 nm.

A second dielectric layer 816 is provided on or above the floating gate layer 814. In one embodiment of the invention, the second dielectric layer 816 (coupling dielectric layer) is a thermally grown oxide, although other deposition techniques and/or materials may be used in alternative embodiments of the invention. Furthermore, the second dielectric layer thickness may range from 10 nm to 50 nm, as will be further illustrated and described below.

A control gate layer 818, e.g., made of polysilicon, is provided on or above the second dielectric layer 816. The control gate layer 818 may have a thickness in the range of 10 nm to 200 nm.

A U-shaped electrically conductive diffusion barrier layer 820 is provided on or above the control gate layer 818. The electrically conductive diffusion barrier layer 820 serves as a diffusion barrier for the material used for the word line 810. Depending on the material used for the word line 810, the electrically conductive diffusion barrier layer 820 may be omitted in alternative embodiments of the invention.

Furthermore, the word line 810 is provided on or above the electrically conductive diffusion barrier layer 820. The word line 810 is made of a low-resistivity material having a resistivity of less than 5 μohmcm. The low-resistivity material may be a metal such as Cu, Al, Ag or Au.

The floating gate layer 814, the second dielectric layer 816, the control gate layer 818, and the electrically conductive diffusion barrier layer 820 (if present, if not present, the word line 810) are covered by an isolation diffusion barrier layer 822 on or above their vertical side surfaces.

Moreover, an isolation material layer 824 is provided in the isolation diffusion barrier layer 822. The isolation diffusion barrier layer 822 serves as a diffusion barrier for the isolation material used for the isolation material layer 824.

Figure 8B:
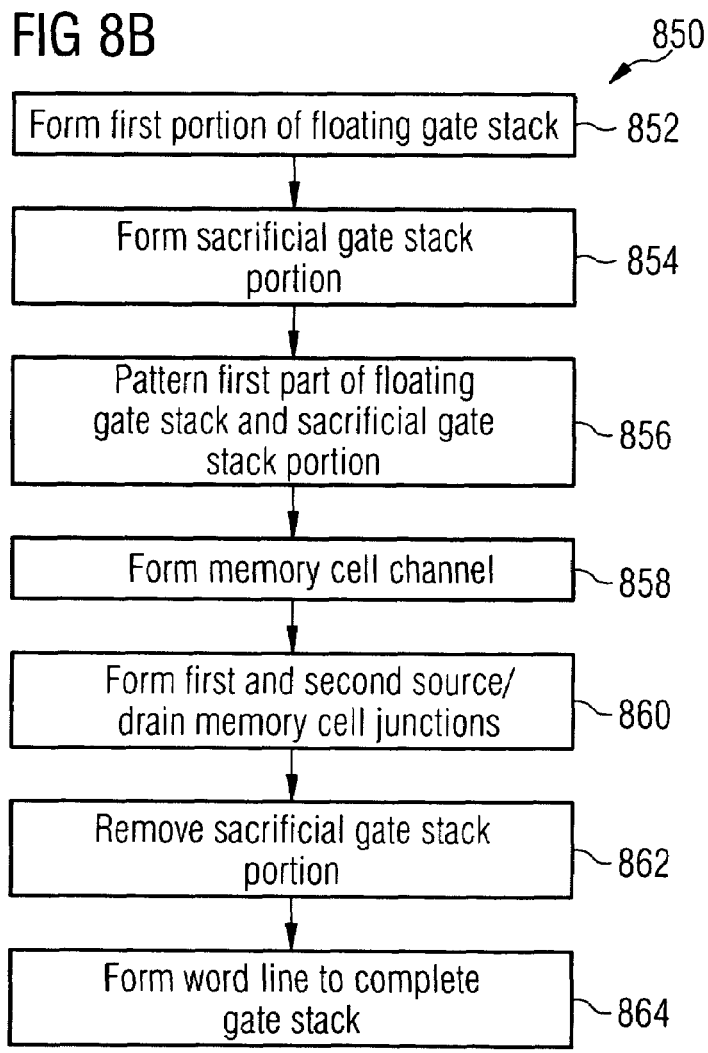
FIG. 8B illustrates an exemplary method for manufacturing a floating gate memory cell in accordance with the present invention.

FIG. 8B illustrates an exemplary method for manufacturing a floating gate memory cell in accordance with the present invention in a flow diagram 850.

At 852, a first portion of a floating gate stack is formed. In exemplary embodiments, process 852 includes growing the first dielectric layer 812 over the channel region 806 to a particular thickness (e.g., 6 nm to 15 nm), and subsequently etching down to arrive at a desired thickness (e.g., 1.5 nm to 5 nm) for the floating gate memory cell. Process 852 further includes forming a floating gate layer 814 over the first dielectric layer 812 to provide the floating gate. Process 852 includes depositing polysilicon as the floating gate layer 814. Furthermore, process 852 includes forming the second dielectric layer 816 on or above the floating gate layer 814. In one embodiment of the invention, the second dielectric layer 816 is thermally grown on or above the floating gate layer 814, although other deposition techniques and/or materials may be used in alternative embodiments of the invention.

At 854, a sacrificial gate stack portion is formed on or above the first portion of the floating gate stack. An exemplary embodiment of process 854 includes depositing an auxiliary mask material (e.g., a hardmask such as SiN or carbon) on or above the second dielectric layer 816 with a desired thickness, e.g., with a thickness of about 50 nm to 500 nm. In an alternative embodiment of the invention, a control gate layer 818 (e.g., made of polysilicon) is deposited on or above the second dielectric layer 816 and an auxiliary mask material (e.g., a hardmask such as SiN or carbon) is deposited on or above the control gate layer 818.

At 856, the first portion of the floating gate stack and the sacrificial gate stack portion are patterned, thereby exposing portions of the first dielectric layer 812 over the main processing surface of the substrate, in which portions of the substrate source/drain junctions of the floating gate memory cell should be formed.

At 858, a channel region 806 is formed. The process of forming the channel region 806 may include implanting halo/enhancement implants.

At 860, a first source/drain junction 802 and a second source/drain junction 804 are implanted and annealed ahead of the formation of the word line 810. In case that no control gate layer 818 is deposited in process 854, the word line 810 also serves as the control gate of the respective floating gate memory cell.

At 862, the patterned sacrificial gate stack portion is removed.

At 864, the word line 810 is formed, thereby completing the floating gate stack. In other words, processes 862 and 864 include replacing the material of the patterned sacrificial gate stack portion by the word line material 810.

FIGS. 9A to 9E illustrate a cross-sectional view along cross sectional line B-B' of FIG. 7 of the NAND array portion 700 in various states of manufacture in accordance with an embodiment of the present invention.

Initially, active areas of NAND strings 702 are formed in the bulk semiconductor substrate 902 (e.g., Si, SiGe, GaAs, and the like), the active areas being isolated by shallow trench isolation barriers (not shown in the figure) using a conventional process flow including depositing a SiN hardmask layer on or above the substrate 902, patterning the SiN hardmask layer, thereby exposing those portions of the substrate

902, in which the STI trenches should be formed. Then, the substrate 902 material is etched anisotropically, e.g., using reactive ion etching, thereby forming trenches in the substrate 902. The trenches are filled with oxide (optionally, a liner may be provided on or above the sidewalls of the trenches before depositing the oxide). The material overfilling the trenches is removed using, e.g., a CMP process with stop on or above the main processing surface of the substrate 902.

Next, the first dielectric layer 904 (tunnel dielectric) is formed (thermally grown as an example) over the active areas. In one embodiment of the invention, the first dielectric layer 904 is grown at a relative large thickness appropriate for the higher voltage cells in the NAND string 702, for example the select gate cells. Next, the desired wells are formed in the substrate 902, which are required for the respective transistors in the NAND array 700.

Next, the floating gate layer 906 is formed by depositing floating gate material such as polysilicon on or above the first dielectric layer 904. After having deposited the floating gate layer 906, the second dielectric layer 908 is deposited on or above the floating gate layer 906. In one embodiment of the invention, an oxide such as silicon oxide may be deposited on or above the floating gate layer 906 as the second dielectric layer 908. It should be mentioned that the second dielectric layer 908 may be deposited only in those regions of the NAND array, in which it is needed, e.g., in which floating gate memory cells are formed (denoted with 910 in FIG. 9A). In one embodiment of the invention, the second dielectric layer 908 is not deposited or only partially deposited in those regions, in which the select gates are formed (denoted with 912 and 914 in FIG. 9A).

Next, the control gate layer 916 is formed by depositing the control gate layer material such as polysilicon on or above the second dielectric layer 908 (where provided) and on or above the floating gate layer 906 (in those regions, in which no second dielectric layer 908 is provided), respectively.

Then, an auxiliary mask layer 918 such as a hardmask layer, e.g., made of SiN or carbon, is deposited on or above the control gate layer 916. Furthermore, active area contact regions 920 and 922 are shown in FIG. 9A, which are provided for the bit line contacts.

This layer stack including the floating gate layer 906, the second dielectric layer 908, the control gate layer 916 and the auxiliary mask layer 918 (e.g., a hardmask made of SiN or carbon) are etched (e.g., using reactive ion etching; in general, any anisotropic etching can be used in this case), such that the regions above the areas, in which the source/drain regions of the floating gate memory cells should be formed, are removed with stop on or above the first dielectric layer 904.

In this way, sacrificial structures 924 are formed, which are located above the channel regions of the floating gate memory cells and the select gates to be formed. Subsequently the source/drain regions 926 are implanted (self-aligned doping) with a predefined dopant profile using the sacrificial gate structures 924 as mask. Then, the source/drain regions 926 are annealed, thereby activating the doping atoms. Certain liners and sidewall spacers (not shown) may be used to limit the lateral extension of the junctions to a certain length below the gate edges. The resulting structure is shown in FIG. 9A.

Figure 9A:
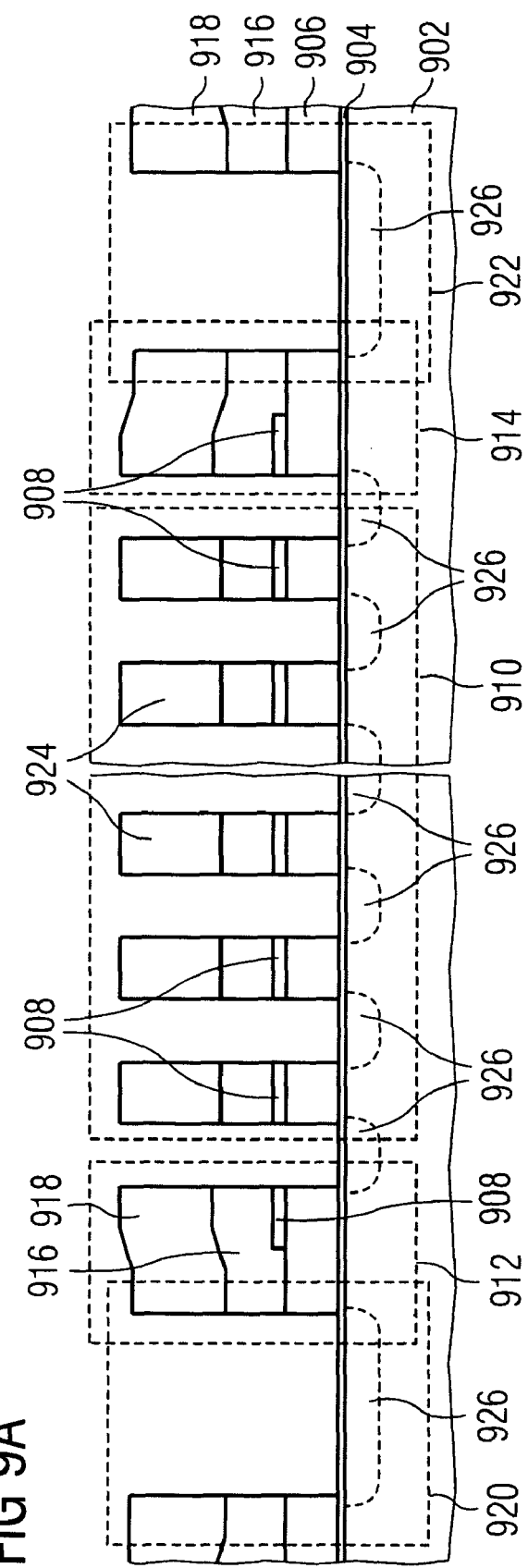

Next, an isolating diffusion barrier layer 928 such as silicon nitride (SiN) or oxinitride (SiON) is deposited on or above the structure of FIG. 9A. Then, the recesses are filled and overfilled with isolation filling material 930 such as with a high density plasma oxide (HDP). The resulting structure is shown in FIG. 9B.

Figure 9B:
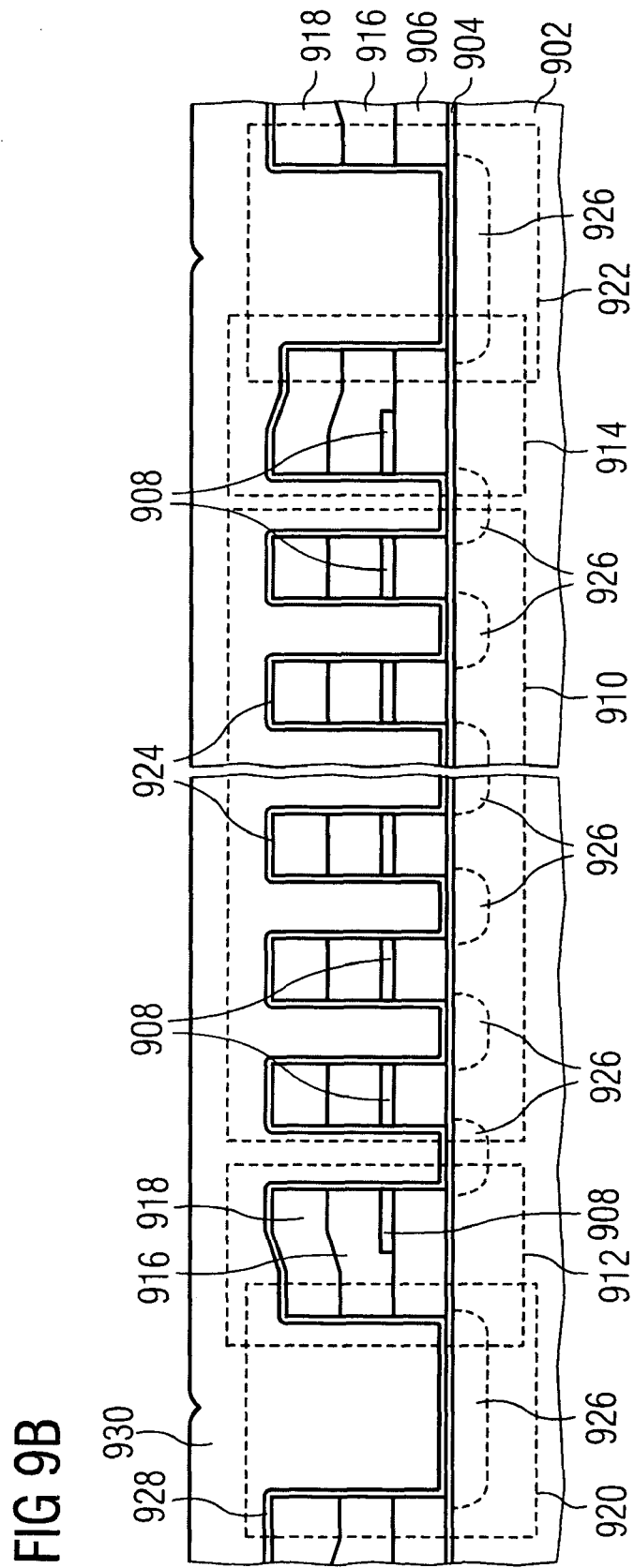
Figure 9C:
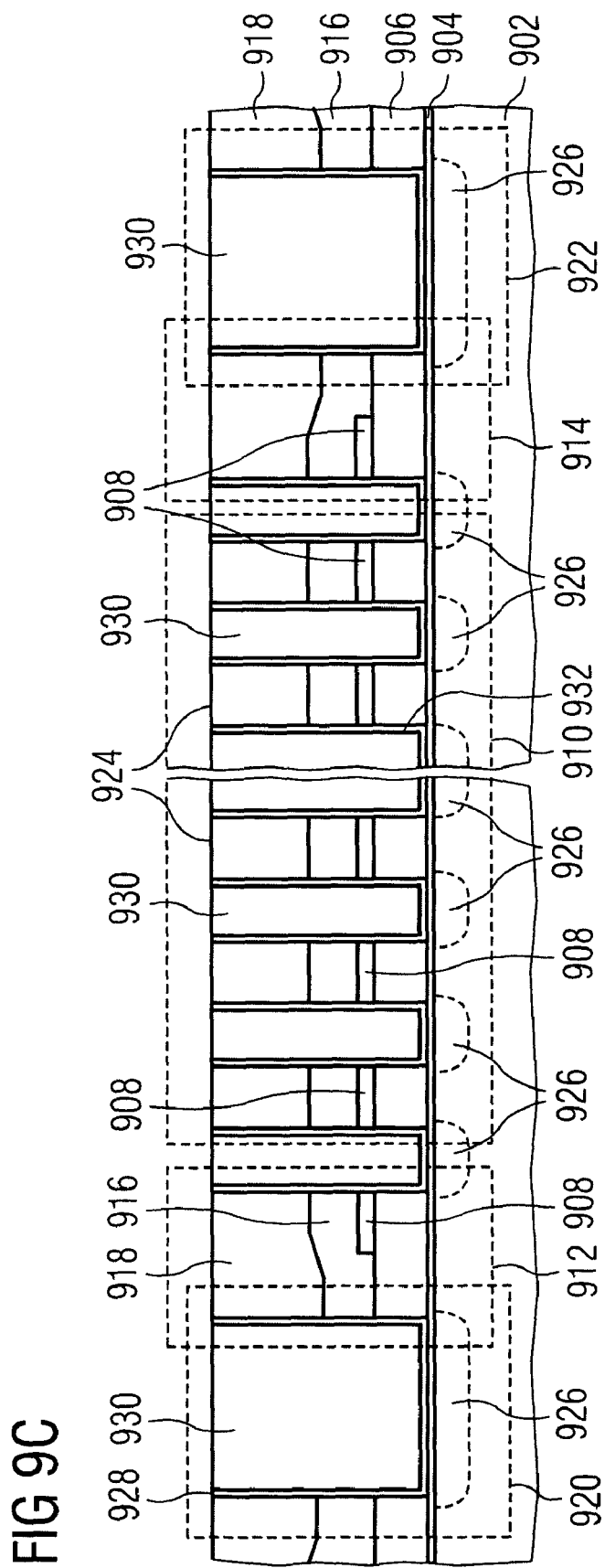

The structure of FIG. 9B is then planarized, e.g., using a CMP process. The resulting structure is shown in FIG. 9C.

Next, the auxiliary mask layer 918 is selectively removed. Then, an electrically conductive diffusion barrier layer 932 is deposited, e.g., by atomic layer depositing Ti, Ta, or TaN. The electrically conductive diffusion barrier layer 932 may include a plurality of layers such as a double layer structure made of, e.g., Ti/TiN or pure Ta/TaN. The pure Ta would react with the polysilicon of the control gate layer 916 to tantalum silicide (TaSi). In general, any other suitable stuffed type diffusion barrier material may be used in an alternative embodiment of the invention. Then, the word line conductor, i.e., the material of the word line 934, such as Cu, is deposited using a plating process. In alternative embodiments of the invention, Al or Ag may be used for the word line 934. It should be noted that for a word line 934 material that does not need a diffusion barrier, the electrically conductive diffusion barrier layer 932 may be omitted. The structure is then planarized, e.g. using a CMP process. The resulting structure is shown in FIG. 9D.

Figure 9E:
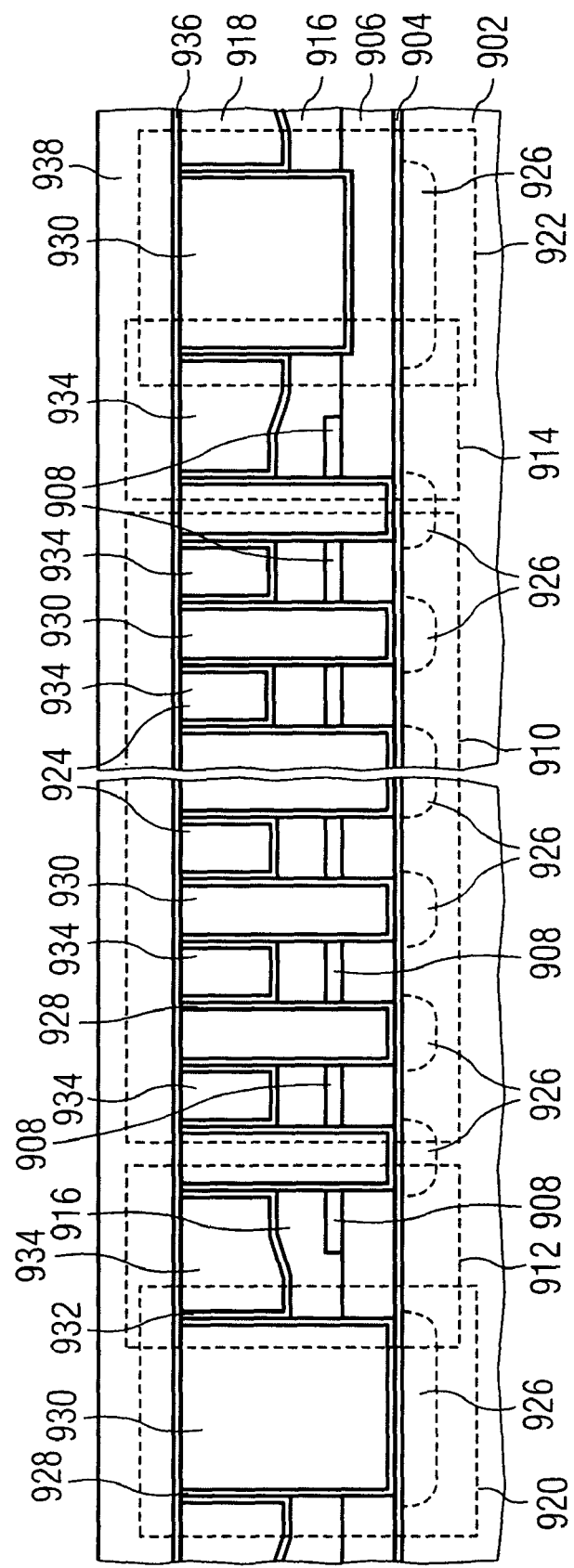

Next, an isolating encapsulation layer 936 made of silicon nitride, for example, is deposited on or above the structure of FIG. 9D. Then, an intermetal dielectric 938, e.g., made of silicon nitride or silicon oxide is deposited for isolation of subsequent metal levels. The resulting structure is shown in FIG. 9E.

Then, the process is continued in a conventional manner to produce the bit line contacts, the source line connection and the bit line as well as the metal wiring, the inter metal isolation and the contact pad formation including the provision of the passivation. These processes are not shown in the figures.

Figure 10:
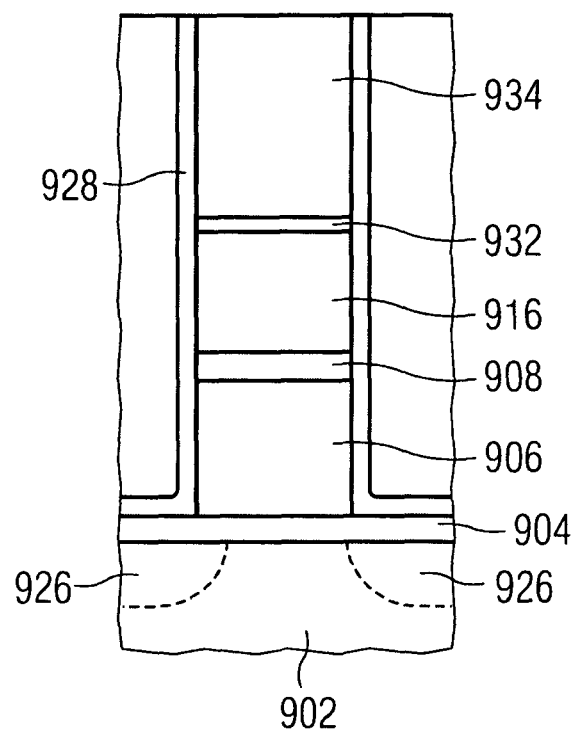
FIG. 10 illustrates a cross-sectional view through cross section B-B' of the NAND memory array shown in FIG. 7 in accordance with another embodiment of the present invention.

FIG. 10 illustrates a cross-sectional view along cross sectional line B-B' of FIG. 7 of the NAND array portion 700 in the completed state of manufacture in accordance with another embodiment of the present invention. In this alternative embodiment of the invention, portions of the isolating diffusion barrier layer 928 above the second dielectric layer 908 or above the control gate layer 916, i.e., those portions of the isolating diffusion barrier layer 928 that are located on the sidewalls of the auxiliary mask layer 918, are removed during removing the auxiliary mask layer 918. This embodiment of the invention may be used in case of similar materials used for the auxiliary mask layer 918 and the isolating diffusion barrier layer 928. Except for this alternative, the other manufacturing processes correspond to the embodiments illustrated with reference to FIGS. 9A to 9E.

Figure 11A:
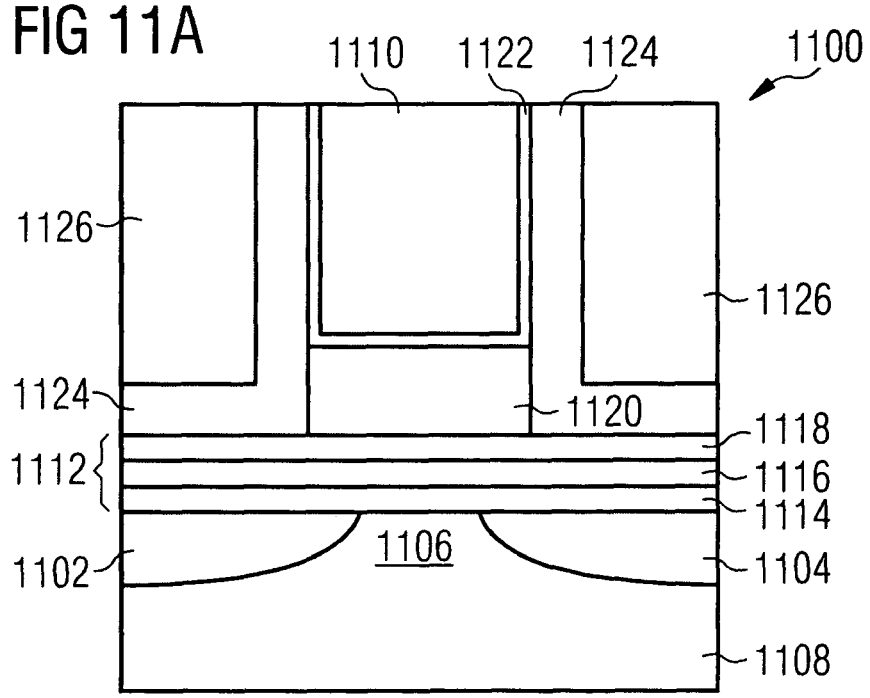
FIG. 11A illustrates a charge-trapping memory cell in accordance with one embodiment of the present invention.

FIG. 11A illustrates a charge-trapping memory cell 1100 in accordance with another embodiment of the present invention. The view illustrates a cross-sectional view of the cell 1100 composed of a first source/drain junction 1102 and a second source/drain junction 1104, and a channel region 1106 formed within an implanted well of a bulk semiconductor substrate 1108. In one embodiment, the charge-trapping memory cell 1100 includes an n-channel device, in which case the first source/drain junction 1102 and the second source/drain junction 1104 are implanted n-type junctions, extending, for example, 20 nm to 40 nm below the surface of the bulk substrate 1108. Of course, the charge-trapping memory cell 1100 may consist of a p-channel device, in which case the first source/drain junction 1102 and the second source/drain junction 1104 will be implanted p-type junctions. The junctions may be slightly modified by implantations, such as lightly doped drain (LDD) and halo implants, which are known to improve short channel behavior.

In one embodiment of the invention, the first source/drain junction 1102 and the second source/drain junction 1104 are implanted before the formation of the word line 1110. Further, the first source/drain junction 1102 and the second source/drain junction 1104 may include a dopant implant of a predefined impurity profile, whereby the impurity profile is characterized by a diffusion temperature (e.g., 850° C.), above which the dopant profile begins to diffuse. As will be described in more detail below, forming the word lines 1110 is performed at temperatures below this diffusion temperature, thereby enabling the usage of a high conductivity metal such as Cu, Al, Ag, Au, which has a melting point below the diffusion temperature.

The channel region 1106 optionally includes an enhancement implant, such as a halo implant or an LDD implant (as stated before) to enhance the channel doping concentration. For example, the end portions of the channel region 1106 of an n-channel device may include a halo implant including a p-type doping that is slightly higher than that of the p-well. Similarly, an n-type halo implant may be employed at the end portion of a channel region 1106 of a p-channel device, the implanted halo having a slightly higher doping concentration than the n-well in the channel region 1106. Additionally, the first well of the memory device 1100 (e.g., a p-well) may be formed within a second well (e.g., an n-well), thereby forming a triple well structure.

A charge-trapping layer stack 1112 is provided on or above the main process surface of the semiconductor substrate 1108 at least above the channel region 1106. The charge-trapping layer stack 1112 includes at least one dielectric layer. In one embodiment, the charge-trapping layer stack 1112 includes at least two dielectric layers. In still another embodiment of the invention, the charge-trapping layer stack 1112 includes three dielectric layers.

In one embodiment of the invention, the charge-trapping layer stack 1112 includes a first dielectric layer 1114 and a charge-trapping layer 1116 coupled to the channel region 1106 via the first dielectric layer 1114. In one embodiment of the invention, the first dielectric layer 1114 (gate/tunnel oxide layer) is a thermally grown oxide, although other deposition techniques and/or materials may be used in alternative embodiments of the invention. Furthermore, the first dielectric layer thickness may range from 3 nm to 15 nm, as will be further illustrated and described below.

The charge-trapping layer 1116 may include a variety of materials, such as silicon nitride at various thickness, e.g., 3 nm to 10 nm, and may be formed in either a single continuous section, or multiple sections in accordance with the invention. Further, the charge-trapping layer 1116 may include either a substantially homogenous composition, e.g., Si-rich SiN, or include a composition of charge-trapping nanoprecipitates as described above with reference to FIGS. 4A and 4B.

In one embodiment of the invention, the charge-trapping layer stack 1112 further includes a second dielectric layer 1118, which may be formed by a crystalline or a polycrystalline material such as silicon oxide. The second dielectric layer 1118 is formed above at least a portion of the charge-trapping layer 1116. In an alternative embodiment, the second dielectric layer 1118 is an amorphous second dielectric layer 1118. Examples of the second dielectric layer 1118 include amorphous $Al_2O_3$, $Ta_2O_5$, $HfO_2$, $ZrO_2$, $SiO_2$, or combinations thereof and other highly-amorphous materials available in the particular fabrication process used. The term "highly amorphous" will be evident to those skilled in the art in comparison to crystalline state materials, although quantitatively, "highly amorphous" can be said to refer to a material in which less than 15 percent of the volume fraction is in an ordered (i.e., crystalline) state, an exemplary range being less than 10 percent, another exemplary range being less than 5 percent, and another exemplary range being less than 2 percent. The highly-amorphous property of the second dielectric layer 1118 creates a high reverse barrier height between a gate contact layer 1120, which is also referred to as control gate layer 1120 in the following, and the charge-trapping layer 1116 which inhibits the transfer of charge between the charge-trapping layer 1116 to the gate contact layer 1120. As noted above, the highly-amorphous second dielectric layer 1118 is characterized by a crystallization temperature, above which the second dielectric layer 1118 begins to become substantially non-amorphous, or in one embodiment, exhibits an ordered state in greater than 15 percent of its volume fraction. The temperature range of crystallization will depend largely upon the temperature and the duration over which the temperature is applied. As an example, the crystallization temperature for $Al_2O_3$ may range from 700 to 1000° C. For practical cases, in which the annealing time is less than 10 seconds, significant crystallization of $Al_2O_3$ is observed above 800° C.

The gate contact layer 1120 is coupled to the charge-trapping layer 1116 via the second dielectric layer 1118. In one embodiment of the invention, the gate contact layer 1120 may include either n-doped or p-doped gate conductor material. The control gate layer 1120 may have a thickness in the range of 10 nm to 200 nm.

A U-shaped electrically conductive diffusion barrier layer 1122 is provided on or above the control gate layer 1120. The electrically conductive diffusion barrier layer 1122 serves as a diffusion barrier for the material used for the word line 1110. Depending on the material used for the word line 1110, the electrically conductive diffusion barrier layer 1122 may be omitted in alternative embodiments of the invention.

Furthermore, the word line 1110 is provided on or above the electrically conductive diffusion barrier layer 1122. The word line 1110 is made of a low-resistivity material having a resistivity of less than or equal to 5 μohmcm. The low-resistivity material may be a metal such as Cu, Al, Ag or Au.

The layers of the charge-trapping layer stack 1112, the control gate layer 1120, and the electrically conductive diffusion barrier layer 1122 (if present, if not present, the word line 1110) are covered by an isolation diffusion barrier layer 1124 on their vertical sidewall surfaces.

Moreover, an isolation material layer 1126 is provided in the isolation diffusion barrier layer 1124. The isolation diffusion barrier layer 1124 serves as a diffusion barrier for the isolation material used for the isolation material layer 1126.

FIG. 11B illustrates an exemplary method for manufacturing a charge-trapping memory cell in accordance with the present invention in a flow diagram 1150.

At 1152, a first portion of a charge-trapping gate stack is formed. In exemplary embodiments, process 1152 includes growing the first dielectric layer 1114 over the channel region 1106 to a particular thickness (e.g., 6 nm to 15 nm), and subsequently etching down to arrive at a desired thickness (e.g., 1.5 nm to 5 nm) for the charge-trapping memory cell. Process 1152 further includes forming a charge-trapping layer 1116 over the first dielectric layer 1114. Process 1152 includes depositing silicon nitride as the charge-trapping layer 1116. Furthermore, process 1152 includes forming the second dielectric layer 1118 on or above the charge-trapping layer 1116. In one embodiment of the invention, the second dielectric layer 1118 is thermally grown on or above the charge-trapping layer 1116, although other deposition techniques and/or materials may be used in alternative embodiments of the invention.

At 1154, a sacrificial gate stack portion is formed on or above the first portion of the charge-trapping gate stack. An exemplary embodiment of process 1154 includes depositing an auxiliary mask material (e.g., a hardmask such as SiN or carbon) on or above the second dielectric layer 1118 with a desired thickness, e.g., with a thickness of about 50 nm to 500 nm. In an alternative embodiment of the invention, process 1154 includes depositing a gate layer 1120 on or above the second dielectric layer 1118 and depositing an auxiliary mask material (e.g., a hardmask such as SiN or carbon) on or above the gate layer 1120.

At 1156, the sacrificial gate stack portion are patterned, thereby exposing portions of the second dielectric layer 1118. The exposed portions of the second dielectric layer 1118 are located above portions of the main processing surface of the substrate, in which source/drain junctions of the floating gate memory cell should be formed.

At 1158, a channel region 1106 is formed. The process of forming the channel region 1106 may include implanting halo/enhancement implants, as described above.

At 1160, a first source/drain junction 1102 and a second source/drain junction 1104 are implanted and annealed ahead of the formation of the word line 1110.

At 1162, the patterned sacrificial gate stack portion is at least partially removed.

At 1164, the word line 1110 is formed, thereby completing the charge-trapping stack. In other words, processes 1162 and 1164 include replacing the material of at least a part of the patterned sacrificial gate stack portion by the word line material 1110.

FIGS. 12A to 12E illustrate a cross-sectional view along cross sectional line B-B' of FIG. 7 of the NAND array portion 700 in various states of manufacture in accordance with another embodiment of the present invention.

Initially, active areas of NAND strings 702 are formed in the bulk semiconductor substrate 1202 (e.g., Si, SiGe, GaAs, and the like), the active areas being isolated by shallow trench isolation barriers (not shown in the figure) using a conventional process flow including depositing a SiN hardmask layer on or above the substrate 1202, patterning the SiN hardmask layer, thereby exposing those portions of the substrate 1202, in which the STI trenches should be formed. Then, the substrate 1202 material is etched anisotropically, e.g., using reactive ion etching, thereby forming trenches in the substrate 1202. The trenches are filled with oxide (optionally, a liner may be provided on or above the sidewalls of the trenches before depositing the oxide). The material overfilling the trenches is removed using, e.g., a CMP process with stop on or above the main processing surface of the substrate 1202.

Next, the first dielectric layer 1204 (tunnel dielectric) is formed (thermally grown as an example) over the active areas. In one embodiment of the invention, the first dielectric layer 1204 is grown at a relative large thickness appropriate for the higher voltage cells in the NAND string 702, for example the select gate cells. Next, the desired wells are formed in the substrate 1202, which are required for the respective transistors in the NAND array 700.

Next, the charge-trapping layer 1206 is formed by depositing charge-trapping material such as silicon nitride on or above the first dielectric layer 1204. After having deposited the charge-trapping layer 1206, the second dielectric layer 1208 is deposited on or above the charge-trapping layer 1206. In one embodiment of the invention, an oxide such as silicon oxide may be deposited on or above the charge-trapping layer 1206 as the second dielectric layer 1208. It should be mentioned that the second dielectric layer 1208 may be deposited only in those regions of the NAND array, in which it is needed, e.g. in which charge-trapping memory cells are formed (denoted with 1210 in FIG. 12A). For example, the second dielectric layer 1208 is not deposited or only partially deposited in those regions, in which the select gates are formed (denoted with 1212 and 1214 in FIG. 12A).

Next, the gate layer 1216 is formed by depositing the gate layer 1216 material such as polysilicon on or above the second dielectric layer 1208 (where provided) and on or above the first dielectric layer 1204 (in those regions, in which no charge-trapping layer 1206 and no second dielectric layer 1208 is provided), respectively.

Then, an auxiliary mask layer 1218 such as a hardmask layer, e.g., made of SiN or carbon, is deposited on or above the gate layer 1216. Furthermore, active area contact regions 1220 and 1222 are shown in FIG. 12A, which are provided for the bit line contacts.

A layer stack including the gate layer 1216 and the auxiliary mask layer 1218 (e.g., a hardmask made of SiN or carbon) are etched (e.g., using reactive ion etching; in general, any anisotropic etching can be used in this case), such that the regions above the areas, in which the source/drain regions of the charge-trapping memory cells should be formed, are removed with etch stop on or above the first dielectric layer 1204 (in those regions, in which neither the charge-trapping layer 1206 nor the second dielectric layer 1208 are provided) or with etch stop on or above the second dielectric layer 1208 (in those regions, in which the charge-trapping layer 1206 and the second dielectric layer 1208 are provided).

In this way, sacrificial structures 1224 are formed, which are located above the channel regions of the charge-trapping memory cells and the select gates to be formed. Subsequently, the source/drain regions 1226 are implanted (self-aligned doping) with a predefined dopant profile using the sacrificial gate structures 1224 as mask. Then, the source/drain regions 1226 are annealed, thereby activating the doping atoms. Certain liners and sidewall spacers (not shown) may be used to limit the lateral extension of the junctions to a certain length below the gate edges. The resulting structure is shown in FIG. 12A.

Figure 12A:
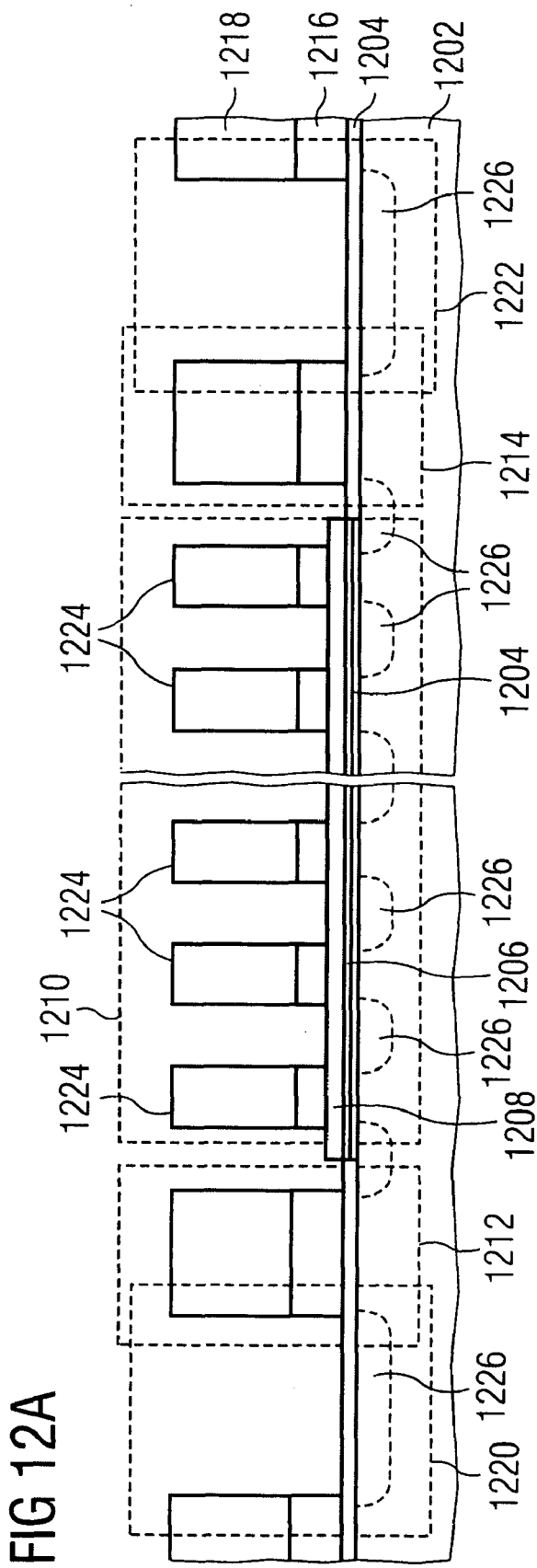

Next, an isolating diffusion barrier layer 1228 such as silicon nitride (SiN) or oxinitride (SiON) is deposited on or above the structure of FIG. 12A. Then, the recesses are filled and overfilled with isolation filling material 1230 such as with a high density plasma oxide (HDP). The resulting structure is shown in FIG. 12B.

Figure 12B:
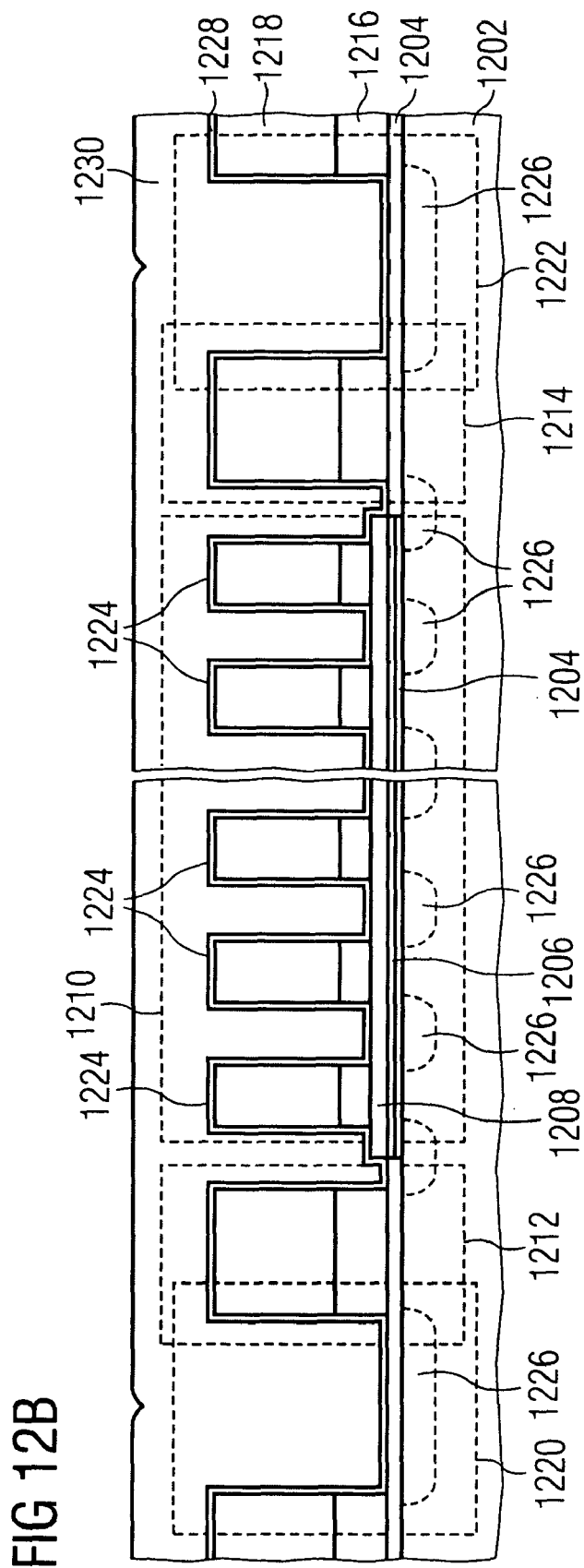
Figure 12C:
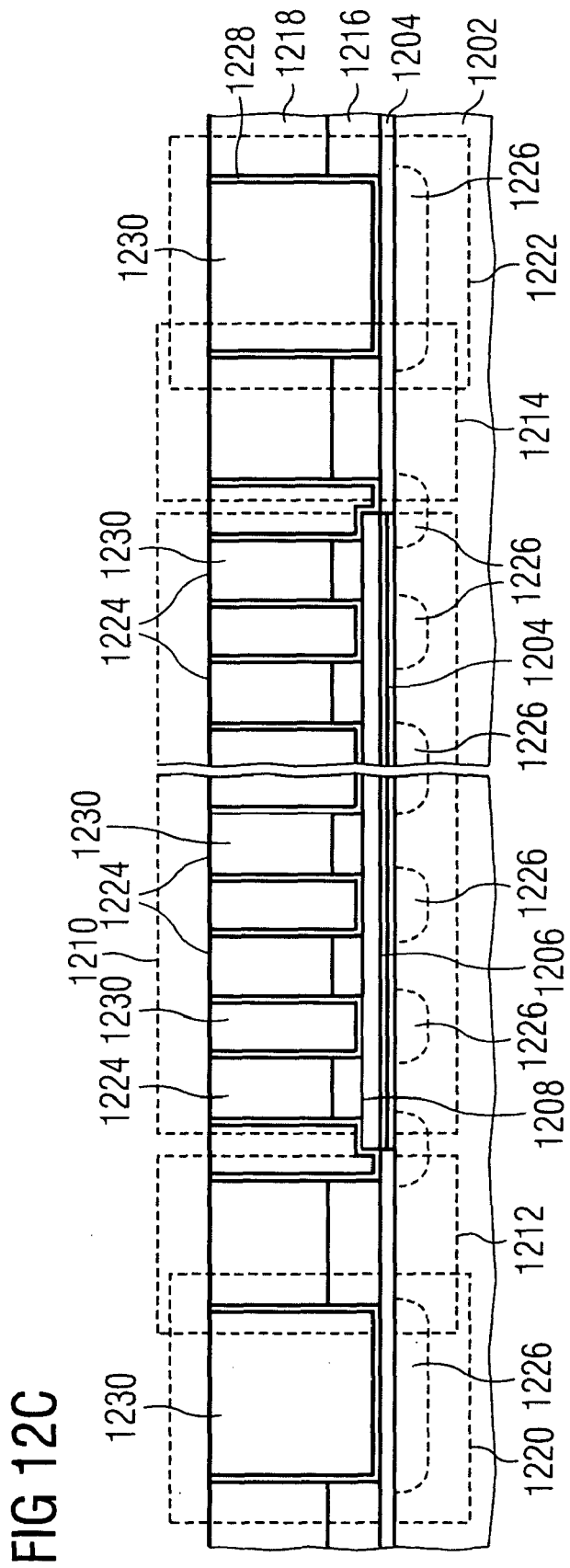

The structure of FIG. 12B is then planarized, e.g., using a CMP process. The resulting structure is shown in FIG. 12C.

Next, the auxiliary mask layer 1218 is selectively removed. Then, an electrically conductive diffusion barrier layer 1232 is deposited, e.g., by atomic layer depositing Ti, Ta, or TaN. The electrically conductive diffusion barrier layer 1232 may include a plurality of layers such as a double layer structure made of e.g. Ti/TiN or pure Ta/TaN. The pure Ta would react with the polysilicon of the gate layer 1216 to tantalum silicide (TaSi). Then, the word line conductor, i.e., the material of the word line 1234, such as Cu, is deposited using a plating process. In alternative embodiments of the invention, Al or Ag may be used for the word line 1234. It should be noted that for a word line 1234 material that does not need a diffusion barrier, the electrically conductive diffusion barrier layer 1232 may be omitted. The structure is then planarized, e.g., using a CMP process. The resulting structure is shown in FIG. 12D.

Figure 12D:
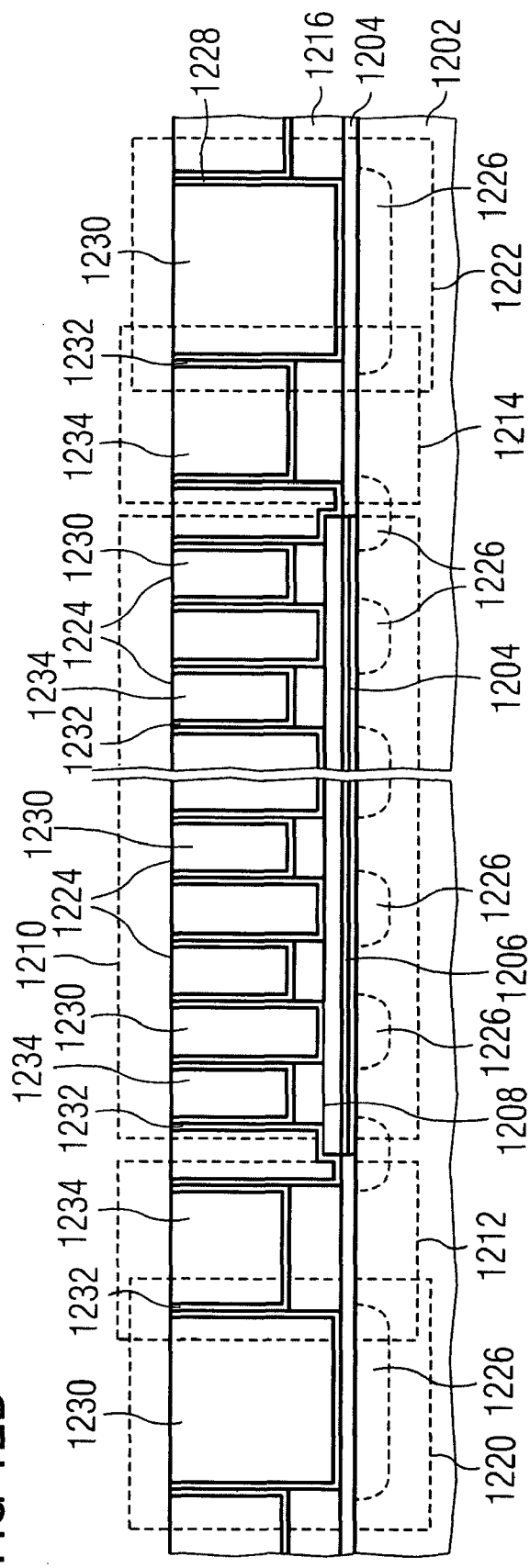

Next, an isolating encapsulation layer 1236 made of silicon nitride, for example, is deposited on or above the structure of FIG. 12D. Then, an intermetal dielectric 1238, e.g., made of silicon nitride or silicon oxide is deposited for isolation of subsequent metal levels. The resulting structure is shown in FIG. 12E.

Then, the process is continued in a conventional manner to produce the bit line contacts, the source line connection and the bit line as well as the metal wiring, the inter metal isolation and the contact pad formation including the provision of the passivation. These processes are not shown in the figures.

Figure 13:
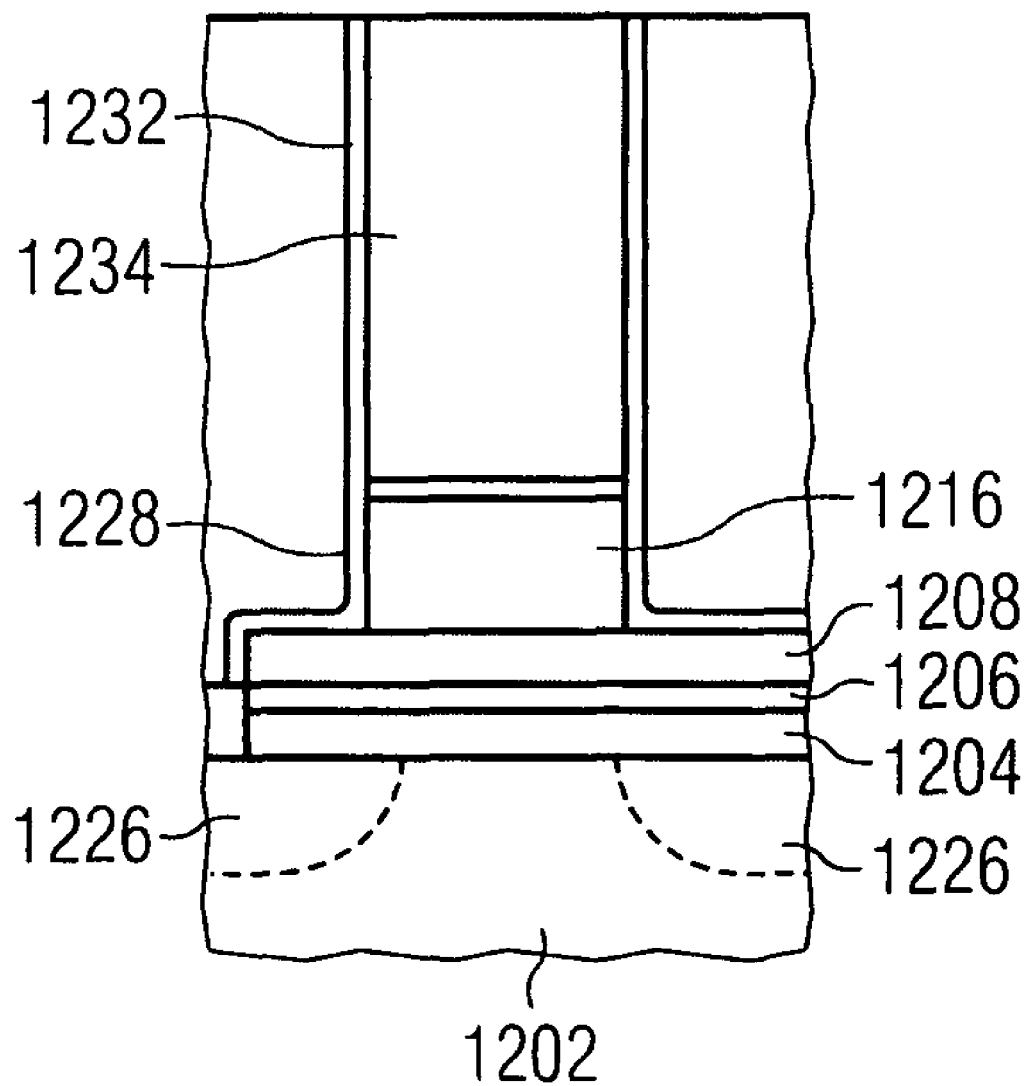
FIG. 13 illustrates a cross-sectional view through cross section B-B' of the NAND memory array shown in FIG. 7 in accordance with another embodiment of the present invention.

FIG. 13 illustrates a cross-sectional view along cross sectional line B-B' of FIG. 7 of the NAND array portion 700 in the completed state of manufacture in accordance with another embodiment of the present invention. In this alternative embodiment of the invention, portions of the isolating diffusion barrier layer 1228 above the second dielectric layer 1208 or above the control gate layer 1216, i.e., those portions of the isolating diffusion barrier layer 1228 that are located on the sidewalls of the auxiliary mask layer 1218, are removed during removing the auxiliary mask layer 1218. This embodiment of the invention may be used in case of similar materials used for the auxiliary mask layer 1218 and the isolating diffusion barrier layer 1228. Except for this alternative, the other manufacturing processes correspond to the embodiments illustrated with reference to FIGS. 12A to 12E.

As readily appreciated by those skilled in the art, the described processes may be implemented in hardware, software, firmware or a combination of these implementations as appropriate. In addition, some or all of the described processes may be implemented as computer readable instruction code resident on a computer readable medium (removable disk, volatile or non-volatile memory, embedded processors, etc.), the instruction code operable to program a computer of other such programmable device to carry out the intended functions.

In one embodiment of the invention, the memory cells may be planar memory cells. However, in an alternative embodiment of the invention, the memory cells may have a curved channel memory cell. In yet another embodiment of the invention, the memory cells may be fin field effect transistor memory cell, in general, a multi-gate field effect transistor memory cell having three or even more gates controlling the conductivity of the channel.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A method of manufacturing at least one semiconductor component, the method comprising:
    forming a layer structure on or above a semiconductor substrate, the semiconductor substrate comprising a first substrate region and a second substrate region wherein a gate isolation layer is formed on or above the substrate;
    the first substrate region is provided for manufacturing non-memory semiconductor components;
    the second substrate region is provided for manufacturing memory semiconductor components;
    patterning the layer structure, thereby exposing at least one region of the semiconductor substrate to be doped;
    forming a doped region by doping the exposed at least one region of the semiconductor substrate to be doped;
    annealing the doped region;
    at least partially removing the patterned layer structure only in the second substrate region, wherein the remaining patterned layer structure in the first substrate region forms the non-memory semiconductor components;
    forming a charge storage layer structure on or above the gate isolation layer in the second substrate region, in which the patterned layer structure has been removed, thereby forming at least one NAND-coupled semiconductor component.

2. The method of claim 1, wherein forming the layer structure on or above a semiconductor substrate further comprises forming a gate layer on or above the gate isolation layer.

3. The method of claim 2, wherein forming the layer structure on or above a semiconductor substrate further comprises forming an auxiliary mask layer on or above the gate layer.

4. The method of claim 3, wherein forming the auxiliary mask layer on or above the gate layer comprises forming the auxiliary mask layer on or above the gate layer using a material for the auxiliary mask layer selected from the group of materials consisting of silicon oxide, silicon nitride and carbon.

5. The method of claim 3, further comprising, forming a further mask layer on or above the auxiliary mask layer.

6. The method of claim 5, wherein forming the further mask layer on or above the auxiliary mask layer comprises forming a photoresist layer on or above the auxiliary mask layer.

7. The method of claim 1, wherein patterning the layer structure comprises exposing at least two regions to be doped.

8. The method of claim 7, wherein doping the exposed at least one region to be doped comprises forming a first source/drain region and a second source drain region.

9. The method of claim 1, wherein annealing the doped region comprises activating the doped region.

10. The method of claim 1, wherein annealing the doped region comprises annealing the doped region at a temperature of at least 800° C.

11. The method of claim 1, wherein manufacturing at least one semiconductor component comprises manufacturing a plurality of NAND-coupled semiconductor components.

12. The method of claim 11, further comprising:
    at least partially filling trenches in the patterned layer structure above at least two doped regions with a filling material; and
    at least partially removing the patterned layer structure using the filling material as a mask.

13. The method of claim 12, wherein the filling material comprises an oxide.

14. The method of claim 12, wherein at least partially removing the patterned layer structure comprises removing the auxiliary mask layer.

15. The method of claim 14, wherein at least partially removing the patterned layer structure comprises removing a gate layer.

16. The method of claim 1, wherein forming the charge storage layer structure comprises forming a floating gate layer.

17. The method of claim 16, wherein forming the charge storage layer structure comprises forming a charge-trapping layer structure.

18. The method of claim 17, wherein the charge-trapping layer structure comprises a dielectric layer made of a material selected from the group consisting of $Si_3N_4$, $Al_2O_3$, $HfO_2$, $ZrO_2$, $Y_2O_3$, $LaO_2$, amorphous silicon, $Ta_2O_5$, $TiO_2$, and an aluminate.

19. The method of claim 17, wherein the charge-trapping layer structure comprises a nitride-oxide layer structure.

20. The method of claim 1, wherein forming a layer structure on or above the substrate further comprises forming a gate layer structure on or above the gate isolation layer.

21. The method of claim 20, wherein forming the gate layer structure comprises:
forming a floating gate layer on or above the gate isolation layer;
forming a dielectric layer on or above the floating gate layer; and
forming a control gate layer on or above the dielectric layer.

22. The method of claim 20, wherein forming the layer structure on or above the substrate comprises forming an auxiliary mask layer on or above the gate layer structure.

23. The method of claim 1, wherein forming the layer structure on or above the substrate further comprises forming a charge-trapping layer structure on or above the gate isolation layer.

24. The method of claim 23, wherein the charge-trapping layer structure comprises a dielectric layer made of a material selected from the group consisting of $Si_3N_4$, $Al_2O_3$, $HfO_2$, $ZrO_2$.

25. The method of claim 23, wherein the charge-trapping layer structure comprises an nitride-oxide layer structure.

26. The method of claim 23, wherein forming the layer structure on or above the substrate further comprises forming a control gate layer on or above the charge-trapping layer structure.

27. The method of claim 26, wherein forming the layer structure on or above the substrate comprises forming an auxiliary mask layer on or above the charge-trapping layer structure.

28. The method of claim 12, further comprising:
forming a diffusion barrier layer in the trenches in the patterned layer structure above the at least two doped regions; and
at least partially filling the trenches with a filling material on or above the diffusion barrier layer.

29. The method of claim 28, wherein the diffusion barrier layer comprises silicon nitride or silicon oxynitride.

30. The method of claim 27, wherein at least partially removing the patterned layer structure comprises removing the auxiliary mask layer.

31. The method of claim 30, wherein forming conductive material comprises forming a conductive diffusion barrier layer.

32. The method of claim 30, wherein forming conductive material comprises forming word line conductor material.

33. The method of claim 32, wherein forming word line conductor material comprises forming word line metal.

34. The method of claim 33, wherein the word line metal has a resistivity of less than 10 $\mu\Omega m$.

35. The method of claim 34, wherein the word line metal has a resistivity of less than or equal to 6 $\mu\Omega cm$.

36. The method of claim 35, wherein the word line metal has a resistivity of less than or equal to 5 $\mu\Omega cm$.

37. The method of claim 33, wherein the word line metal is selected from the group consisting of Cu, Al, Ag and Au.

38. A method of manufacturing a memory arrangement, the method comprising,
forming a layer structure on or above a substrate, the substrate comprising a first substrate region and a second substrate region, wherein a gate isolation layer is formed on or above the substrate;
the first substrate region is provided for manufacturing select semiconductor components;
the second substrate region is provided for manufacturing memory semiconductor components;
patterning the layer structure, thereby exposing a plurality of regions to be doped;
doping the exposed regions to be doped;
annealing the doped regions;
at least partially removing the patterned layer structure only in the second substrate region, wherein the remaining patterned layer structure in the first substrate region forms gate structures of the select semiconductor components;
forming a charge storage layer structure on or above the gate isolation layer in the region in which the patterned layer structure has been removed; and
forming conductive material on or above the charge storage layer structure, thereby forming a NAND-coupled memory arrangement.

39. The method of claim 38, wherein the memory arrangement comprises a charge-trapping memory arrangement.

* * * * *